United States Patent
Funk et al.

(10) Patent No.: US 7,967,995 B2
(45) Date of Patent: Jun. 28, 2011

(54) MULTI-LAYER/MULTI-INPUT/MULTI-OUTPUT (MLMIMO) MODELS AND METHOD FOR USING

(75) Inventors: Merritt Funk, Austin, TX (US); Radha Sundararajan, Dripping Springs, TX (US); Hyung Joo Lee, Austin, TX (US); Daniel Prager, Hopewell Junction, NY (US); Asao Yamashita, Fishkill, NY (US)

(73) Assignee: Tokyo Electron Limited, Tokyo (JP)

( * ) Notice: Subject to any disclaimer, the term of this patent is extended or adjusted under 35 U.S.C. 154(b) by 745 days.

(21) Appl. No.: 12/059,624

(22) Filed: Mar. 31, 2008

(65) Prior Publication Data
US 2009/0242513 A1 Oct. 1, 2009

(51) Int. Cl.
*G06F 17/00* (2006.01)
*C23F 1/02* (2006.01)

(52) U.S. Cl. ............... 216/59; 216/67; 216/84; 700/110
(58) Field of Classification Search ................ None
See application file for complete search history.

(56) References Cited

U.S. PATENT DOCUMENTS

| | | | |
|---|---|---|---|
| 7,894,927 B2 * | 2/2011 | Funk et al. | 700/121 |
| 2006/0037701 A1 | 2/2006 | Koshiishi et al. | |
| 2009/0242513 A1 * | 10/2009 | Funk et al. | 216/67 |
| 2010/0036514 A1 * | 2/2010 | Funk et al. | 700/103 |
| 2010/0036518 A1 * | 2/2010 | Funk et al. | 700/121 |
| 2010/0081285 A1 * | 4/2010 | Chen et al. | 438/710 |
| 2010/0214545 A1 * | 8/2010 | Funk et al. | 355/53 |

* cited by examiner

*Primary Examiner* — Allan Olsen

(57) ABSTRACT

The invention provides a method of processing a substrate using multilayer processing sequences and Multi-Layer/Multi-Input/Multi-Output (MLMIMO) models and libraries that can include one or more masking layer creation procedures, one or more pre-processing measurement procedures, one or more Partial-Etch (P-E) procedures, one or more Final-Etch (F-E) procedures, and one or more post-processing measurement procedures.

19 Claims, 20 Drawing Sheets

200A

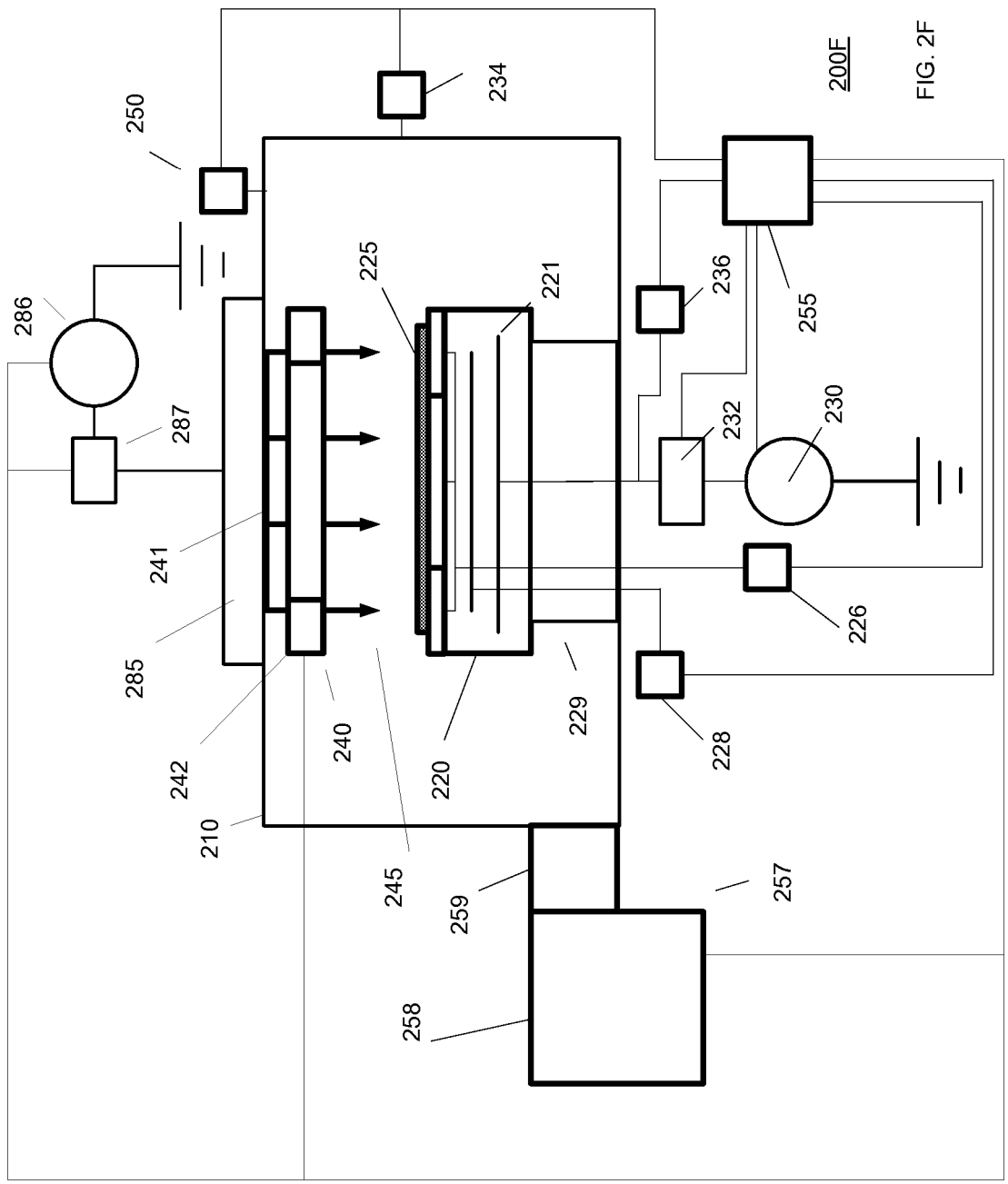

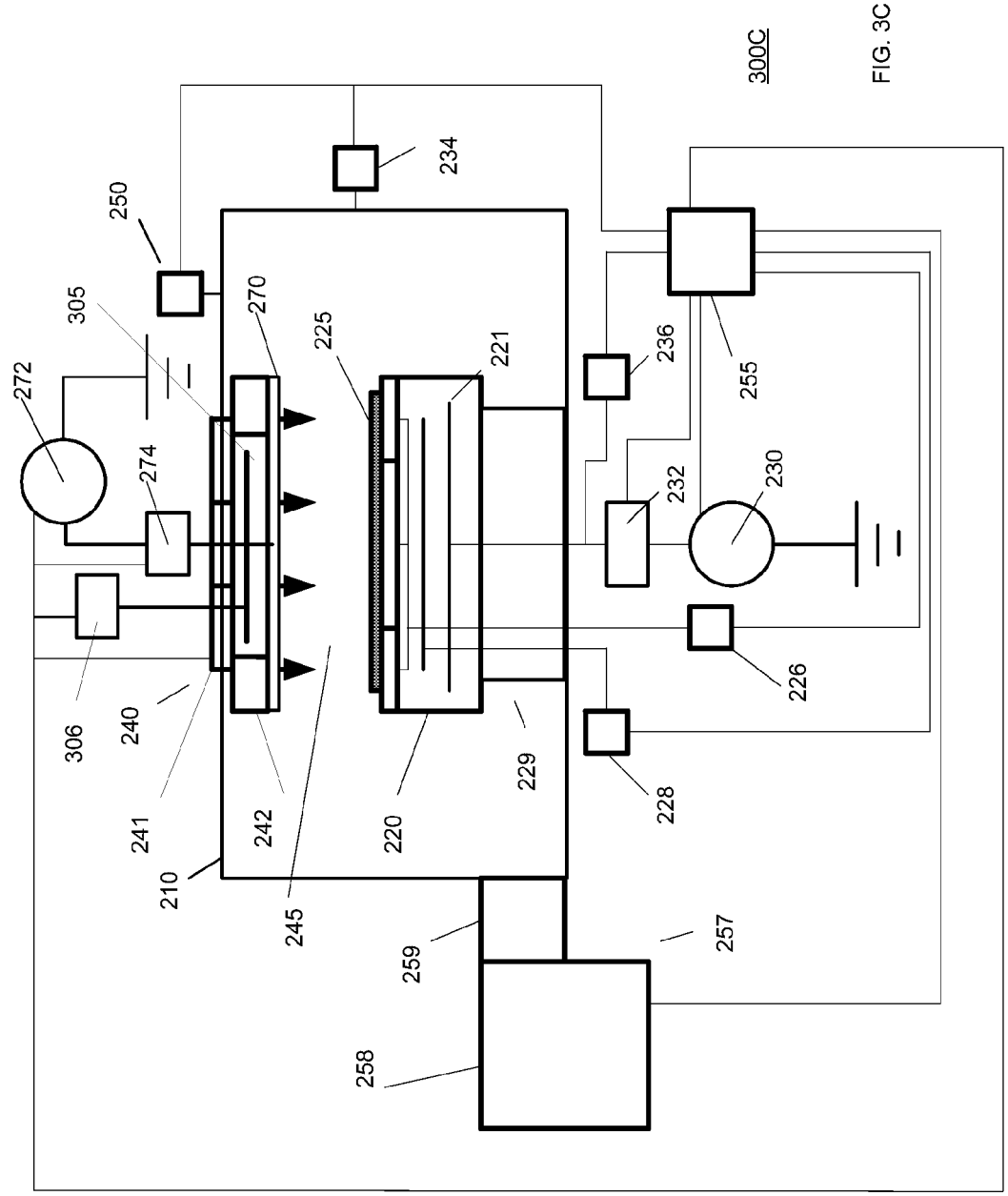

| DOE # | MV-11 | MV-12 | MV-13 | MV-21 | MV-22 | MV-23 | CV-01 | CV-02 | CV-03 | CV-04 | CV-05 | CV-06 |
|---|---|---|---|---|---|---|---|---|---|---|---|---|
| 1 | 0 | 0 | 0 | 0 | 1 | 0 | 11.2 | 0.2 | 1 | 2.0 | 3.2 | 4.4 |
| 2 | 1 | 1 | -1 | 0 | 0 | 1 | 7.2 | 0.8 | 1.6 | 3.3 | 6.3 | 1.2 |
| 3 | 1 | -1 | -1 | -1 | 0 | 1 | 8.0 | 2.2 | 2.2 | 0.8 | 0.8 | 2.9 |
| 4 | 1 | 0 | 0 | 1 | 1 | 0 | 3.3 | 2.2 | 1.2 | 3.3 | 3.2 | 2.7 |
| 5 | 1 | 0 | 1 | 1 | 0 | 0 | 6.2 | 0.5 | 1.1 | 3.8 | 5.5 | 4.2 |
| 6 | 1 | 1 | 1 | 0 | 0 | 1 | 7.5 | .7 | 1.3 | 4.5 | 6.1 | 1.9 |
| 7 | -1 | -1 | 0 | -1 | -1 | -1 | 1.1 | .05 | .2 | 1.2 | 5.9 | 1.2 |
| 8 | -1 | 1 | 1 | 1 | 1 | -1 | 2.9 | 1.5 | .9 | 5.8 | 5.8 | 1.8 |
| 9 | -1 | -1 | 0 | -1 | 0 | -1 | 2.7 | 1.8 | 1.2 | 4.7 | 4.4 | 0.8 |
| 10 | 0 | 0 | 0 | 0 | 0 | 2 | 6.6 | 3.4 | 1.4 | 4.4 | 1.2 | 0.9 |
| 11 | 1 | -2 | 0 | 1 | 1 | -2 | 1.9 | 0.4 | 2.6 | 5.5 | 1.3 | 0.9 |
| 12 | 0 | -2 | 1 | 1 | 1 | 0 | 1.7 | 2.9 | 2.9 | 3.5 | 1.4 | 0.8 |
| 13 | 0 | 2 | 0 | 1 | -1 | 0 | 2.8 | 2.1 | 2.1 | 7.9 | 1.3 | 7.9 |
| 14 | 0 | 2 | -1 | 2 | -2 | 0 | 7.7 | 7.7 | 1.4 | 4.8 | 1.1 | 5.4 |
| 15 | 0 | 0 | 0 | 0 | -2 | 2 | 9.1 | 3.4 | 0.3 | 4.3 | 0.9 | 4.3 |
| 16 | 0 | -2 | 0 | -1 | -2 | 0 | 9.2 | 0.6 | 0.5 | 2.5 | 2.5 | 2.5 |
| 17 | 0 | 0 | 1 | 0 | 1 | -1 | 5.7 | 0.9 | 0.1 | 8.7 | 3.4 | 0.2 |
| 18 | 0 | 0 | 0 | 2 | -1 | 1 | 2.6 | 3.3 | 1.3 | 4.8 | 2.0 | 3.9 |
| 19 | 1 | 2 | -1 | 2 | 1 | 1 | 7.1 | 1.7 | 1.4 | 1.4 | 1.0 | 3.4 |
| 20 | 1 | 2 | -1 | 1 | 2 | -1 | 12.3 | 3.4 | 1.1 | 1.1 | 0.5 | 0.9 |

FIG. 8

MULTI-LAYER/MULTI-INPUT/MULTI-OUTPUT (MLMIMO) MODELS AND METHOD FOR USING

BACKGROUND OF THE INVENTION

1. Field of the Invention

The present invention relates to substrate processing, and more particularly to improving the substrate processing using optimized Multi-Layer/Multi-Input/Multi-Output (MLMIMO) models, procedures, and subsystems.

2. Description of the Related Art

Etch process behavior is inherently non-linear and interacting step-to-step (layers) or as process stacks are compiled (etch/cvd/implant). With the knowledge of the process interactions based on physical modeling of Tokyo Electron Limited (TEL) chambers and base processes and imperial data and measurements from process refinement and tuning the control of Critical Dimension (CD), Sidewall Angle (SWA), depths, film thicknesses, over etching, undercuts, surface cleaning and damage control can be recursively calculated and optimized using multi-input multi-output non-linear models. Current low cost products use a bulk silicon technology. As the transistor continues to shrink, the impact of the channel depth is becoming critical (ultra-shallow source/drain extensions). As the SOI film shrinks, smaller variations in the gate and/or spacer thickness and thickness of the SOI [define SOI] film can affect the transistor's performance. When etch procedures are not controlled, the removal of the material near the gate affects the electrical performance.

Current high performance microprocessors use PD SOI (partially depleted Silicon-on-Insulator film—giving a threshold voltage 0.2 volts. PD SOI films are around 50 nm while the gate and/or spacer reduction amount can be a large percentage (10%) of the total gate and/or spacer thickness. Future generations of SOI films are called FD SOI (fully depleted giving a threshold voltage 0.08 volts and a thickness of ~25 nm). Currently theses films are not in production due to limitations in thickness control uniformity and defects. Channel mobility degrades with decreasing SOI thickness. With thinner SOI film, the control of the gate and/or spacer sidewall thickness becomes more critical.

SUMMARY OF THE INVENTION

The invention can provide apparatus and methods of processing a substrate in real-time using Multi-Layer/Multi-Input/Multi-Output (MLMIMO) processing sequences MLMIMO and evaluation libraries to control gate and/or spacer thickness, to control gate and/or spacer uniformity, and to eliminate damage to the transistor structures.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2A-2F shows exemplary block diagrams of etching subsystems in accordance with embodiments of the invention;

FIGS. 3A-3F shows exemplary block diagrams of additional etching subsystems in accordance with embodiments of the invention;

FIG. 8 illustrates an exemplary Design of Experiments (DOE) table in accordance with embodiments of the invention;

DETAILED DESCRIPTION

Figure 1:
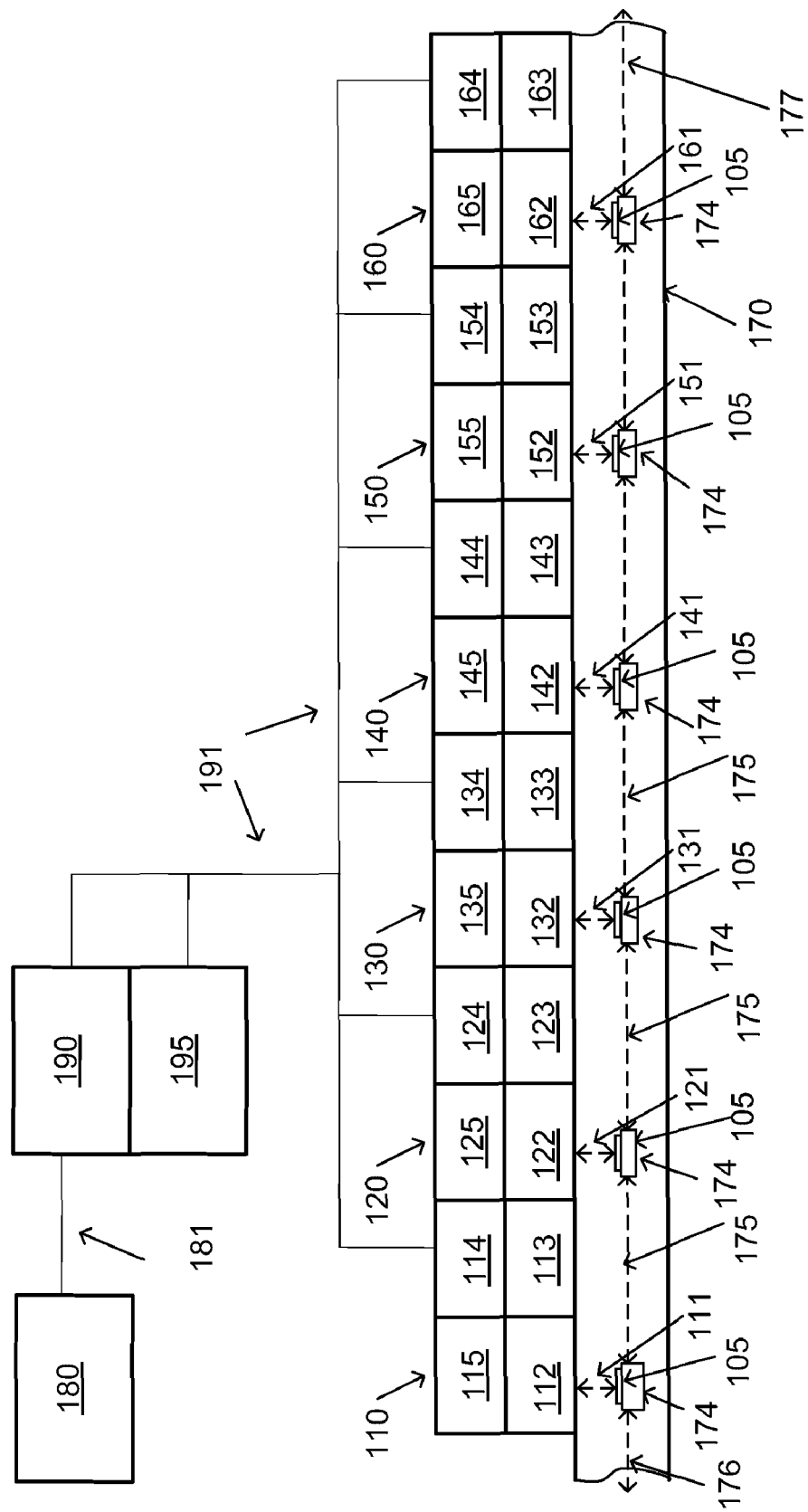
FIG. 1 shows an exemplary block diagram of a processing system in accordance with embodiments of the invention.

The invention provides apparatus and methods for processing substrates having a large number of semiconductor devices thereon and an even larger number of transistor gate and/or spacer structures. In various embodiments, apparatus and methods are provided for creating and/or using an MLMIMO evaluation library, for performing MLMIMO processing sequences that can include one or more measurement procedures, one or more deposition procedures, one or more Partial-Etch (Partial etch) procedures, one or more Full-Etch (Poly Etch) procedures, and/or for verifying MLMIMO models and associated processing sequences.

One or more evaluation features can be provided at various locations on a substrate and can be used to evaluate and/or verify MLMIMO models and associated processing sequences. Substrates can have substrate data associated with them, and the substrate data can include real-time and historical data. In addition, the substrate can have other data associated with them, and the other data can include gate structure data, the number of required sites, the number of visited sites, confidence data and/or risk data for one or more of the sites, site ranking data, transferring sequence data, or process-related data, or evaluation/verification-related data, or any combination thereof. The data associated with MLMIMO-related substrates can include transfer sequence data that can be used to establish when and where to transfer the substrates, and transfer sequences can be change using operational state data.

The MLMIMO model can be subdivided into layers of a finite granularity based on the application need. Each layer can be a physical material, with layer separation denoted by material changes or dimensional layer boundaries. Layers can be combination of layers of layers, such as a metal gate stack of layers and a subsequent spacer deposition and etching of the layer covering the metal gate layers.

Layers can be mapped to etch steps with time or End Point Data (EPD) being used to separate the steps. Additionally a continuous real-time controller can run with real-time updates from a combination of metrology data, sensors, and etch models.

In some embodiments, quadratic programming (QP) can be used for one or more models. For example, quadratic programming can be used to model Center Etch Bias (CEB) as shown below;

CEB=0.480832332*$DI$(CD)−1.1216477*PhotoSWA+ 0.173238994*$u$(1)+0.004487532*$u$(1)$^2$−0.04*$u$(2)$^2$−1.99*$u$(3)+1.3*$u$(4)+81.935 where u(1) is the partial etch time, u(2) is the $O_2$ flow for the partial steps, and u(3) is the $O_2$ flow for the ETCH steps, u(4) is the edge substrate temperature for the partial etch steps When quadratic programming is used, an objective function and constraints can be determined as shown below:

$$ObjectiveFunction = \min\left\{\left(\frac{targetCEB - CEB}{targetCEB}\right)^2 w_1 + \left(\frac{targetCSWAB - CSWAB}{targetCSWAB}\right)^2 w_2 + \left(\frac{targetECDB - ECDB}{targetECDB}\right)^2 w_3 + \left(\frac{targetESWAB - ESWAB}{targetESWAB}\right)^2 w_4\right\}$$

where [$w_1, w_2, w_3, w_4$ = [0.6, 0.1, 0.2, 0.1].

and the Inequality constraints are as shown below:

5≤$u$(1)≤50

5≤$u$(2)≤20

2≤$u$(3)≤10

45≤$u$(4)≤65

In some embodiments, DOE's can be performed to model the process gain of each potential control knob and interactions of the inputs and outputs of each layer, and the interactions and gains of process control loops layer to layer. A method of determining interaction between each control knob and output can be used to evaluate and optimize the model stability such as Relative Gain Array. This information can also drive setup of individual feedback loops that are non-interacting For example, MATLAB can be used to calculate one or more Relative Gain Arrays (RGA) (Skogestad and Postlethwaite, 2005) where RGA=G⊗(G$^{-1}$)$^T$ and □ denotes element-by-element multiplication. In addition, the following pairing rules can be used:

(1) Select RGA elements to be closest to one, and (2) Avoid pairing on negative RGA elements.

An analytical device used in process control multivariable applications, based on the comparison of single-loop control to multivariable control; expressed as an array (for all possible input-output pairs) of the ratios of a measure of the single-loop behavior between an input-output variable pair, to a related measure of the behavior of the same input-output pair under some idealization of multivariable control MLMIMO modeling is used to calculate the optimum inputs for a set of goals (or targeted outputs). Constraints can be ranges of process parameters such as time, gas flows, and temperature by layer. With MLMIMO a set of weightings can be applied to guide the optimizer to prioritize the outputs with most value to the current process calculations at a given time. Target weightings can be used where an equation is applied to the weighting calculation given a target and gain constants that effectively penalizes as the optimizer moves away from target in a linear or non-linear way. Targets' can be a center target or and limit target (above a given value—for example with SWA).

Feedback can take the form of multiple loops, one for each targeted output with a calculation of the feedback error based on the actual less predicted error. With MLMIMO, each prediction output error needs to be calculated and matched with the feedback measurements to determine the real error. Feedback filtering methods such as Exponentially Weighted Moving Averages (EWMA) or Kalman filters can be used to filter noise. Outputs of a layer controller can include a goodness of fit and this GOF value can then be used as the input of a cascading layer controller.

The substrate can be partitioned into one or more upper edge regions, one or more center regions, and one or more lower edge regions.

Layer controllers can contain updates at different times as the processing steps are performed allowing for the controller to make new updates based on past calculations, errors of calculations, changes in tool state or material state then incorporated into the most recent update.

In some examples, the received substrates can have a patterned photoresist layer deposited on them by a previous process or an external system, and the MLMIMO processing sequences can include one or more transfer procedures, one or more metrology procedures, one or more Partial-Etch procedures, one or more Full-Etch procedures, one or more data evaluation procedures, and one or more modeling sequences. For example, transfer sequences can be established based on the number of substrates that require Partial-Etch processing, the number of substrates that require Full-Etch processing, the number of available processing elements, and the number of substrates that require evaluation, the number of available evaluation elements, and the loading data for one or more transfer subsystems.

As feature sizes decrease below the 65 nm node, accurate processing and/or measurement data becomes more important and more difficult to obtain. MLMIMO models and associated processing sequences can be used to more accurately process and/or measure these ultra-small devices and features. The data from an MLMIMO procedure can be compared with the warning and/or control limits, when a run-rule is violated, an alarm can be generated indicating a processing problem, and correction procedures can be performed in real time.

FIG. 1 shows an exemplary block diagram of a processing system in accordance with embodiments of the invention. In the illustrated embodiment, processing system 100 comprises a lithography subsystem 110, a scanner subsystem 120, an etch subsystem 130, a deposition subsystem 140, an inspection subsystem 150, a metrology subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used in MLMIMO models and associated processing sequences.

The system controller 190 can be coupled to the lithography subsystem 110, the scanner subsystem 120, the etch subsystem 130, the deposition subsystem 140, the inspection subsystem 150, the metrology subsystem 160, and the transfer subsystem 170 using a data transfer subsystem 191. The system controller 190 can be coupled to the MES 180 using the data transfer subsystem 181. Alternatively, other configurations may be used. For example, the etch subsystem 130, the deposition subsystem 140, the metrology subsystem 160, and a portion of the transfer subsystem 170 can be part of a Tactras™ System available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled 111 to the transfer subsystem 170. The transfer subsystem 170 can be coupled 111 to the lithography subsystem 110, and one or more substrates 105 can be transferred 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

In some embodiments, the lithography subsystem 110 can perform coating procedures, thermal procedures, measurement procedures, inspection procedures, alignment procedures, and/or storage procedures on one or more substrates using procedures and/or procedures. For example, one or more lithography-related processes can be used to deposit one or more masking layers that can include photoresist material, and/or anti-reflective coating (ARC) material, and can be used to thermally process (bake) one or more of the masking layers. In addition, lithography subsystem 110 can be used to develop, measure, and/or inspect one or more of the patterned masking layers on one or more of the substrates.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the scanner subsystem 120, and one or more substrates 105 can be transferred 121 between the transfer subsystem 170 and the scanner subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

In some embodiments, the scanner subsystem 120 can be used to perform wet and/or dry exposure procedures, and in other cases, the scanner subsystem 120 can be used to perform extreme ultraviolet (EUV) exposure procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled 131 to the transfer subsystem 170. The transfer subsystem 170 can be coupled 131 to the etch subsystem 130, and one or more substrates 105 can be transferred 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, and cleaning procedures, or plasma or non-plasma etching procedures. Evaluation procedures and/or inspection procedures can be used to measure and/or inspect one or more surfaces and/or layers of the substrates. The etch subsystem 130 can be configured as described herein in FIGS. 2A-2F and FIGS. 3A-3F.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more substrates 105 can be transferred 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the substrates.

The inspection subsystem 150 can comprise one or more transfer/storage elements 152, one or more processing elements 153, one or more controllers 154, and one or more evaluation elements 155. One or more of the transfer/storage elements 152 can be coupled to one or more of the processing elements 153 and/or to one or more of the evaluation elements 155 and can be coupled 151 to the transfer subsystem 170. The transfer subsystem 170 can be coupled 151 to the inspection subsystem 150, and one or more substrates 105 can be transferred 151 between the transfer subsystem 170 and the inspection subsystem 150 in real time. For example, the transfer subsystem 170 can be coupled to one or more of the transfer/storage elements 152, to one or more of the processing elements 153, and/or to one or more of the evaluation elements 155. One or more of the controllers 154 can be coupled to one or more of the transfer/storage elements 152, to the one or more of the processing elements 153, and/or to one or more of the evaluation elements 155.

The metrology subsystem 160 can comprise one or more transfer/storage elements 162, one or more processing elements 163, one or more controllers 164, and one or more evaluation elements 165. One or more of the transfer/storage elements 162 can be coupled to one or more of the processing elements 163 and/or to one or more of the evaluation elements 165 and can be coupled 161 to the transfer subsystem 170. The transfer subsystem 170 can be coupled 161 to the metrology subsystem 160, and one or more substrates 105 can be transferred 161 between the transfer subsystem 170 and the metrology subsystem 160 in real time. For example, the transfer subsystem 170 can be coupled to one or more of the transfer/storage elements 162, to one or more of the processing elements 163, and/or to one or more of the evaluation elements 165. One or more of the controllers 164 can be coupled to one or more of the transfer/storage elements 162, to the one or more of the processing elements 163, and/or to one or more of the evaluation elements 165. The metrology subsystem 160 can comprise one or more processing elements 163 that can be used to perform real-time optical metrology procedures that can be used to measure target structures at one or more sites on a substrate using library-based or regression-based techniques. For example, the sites on substrate can include MLMIMO sites, target sites, overlay sites, alignment sites, measurement sites, verification sites, inspection sites, or damage-assessment sites, or any combination thereof. For example, one or more "golden substrates" or reference chips can be stored and used periodically to verify the performance of one or more of the processing elements 163, and/or one or more of the evaluation elements 165.

In some embodiments, the metrology subsystem 160 can include an integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The metrology subsystem 160 can use polarizing reflectometry, spectroscopic ellipsometry, reflectometry, or other optical measurement techniques to measure accurate device profiles, accurate CDs, and multiple layer film thickness of a substrate. The integrated metrology process (iODP) can be executed as an integrated process in an integrated group of subsystems. In addition, the integrated process eliminates the need to break the substrate for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control. Simulated metrology data can be generated by applying Maxwell's equations and using a numerical analysis technique to solve Maxwell's equations.

The transfer subsystem 170 can comprise transfer elements 174 coupled to transfer tracks (175, 176, and 177) that can be used to receive substrates, transfer substrates, align substrates, store substrates, and/or delay substrates. For example, the transfer elements 174 can support two or more substrates.

Alternatively, other transferring means may be used. The transfer subsystem 170 can load, transfer, store, and/or unload substrates based on a MLMIMO model, a MLMIMO-related processing sequence, a transfer sequence, operational states, the substrate and/or processing states, the processing time, the current time, the substrate data, the number of sites on the substrate, the type of sites on the substrates, the number of required sites, the number of completed sites, the number of remaining sites, or confidence data, or any combination thereof.

In some examples, transfer subsystem 170 can use loading data to determine where and when to transfer a substrate. In other examples, a transfer system can use MLMIMO modeling data to determine where and when to transfer a substrate. Alternatively, other procedures may be used. For example, when the first number of substrates is less than or equal to the first number of available processing elements, the first number of substrates can be transferred to the first number of available processing elements in the one or more of the subsystems using the transfer subsystem 170. When the first number of substrates is greater than the first number of available processing elements, some of the substrates can be stored and/or delayed using one or more of the transfer/storage elements (112, 122, 132, 142, 152, and 162) and/or the transfer subsystem 170.

In addition, the one or more subsystems (110, 120, 130, 140, 150, 160, and 170) can be used when performing lithography-related procedures, scanner-related procedures, inspection-related procedures, measurement-related procedures, evaluation-related procedures, etch-related procedures, deposition-related procedures, thermal processing procedures, coating-related procedures, alignment-related procedures, polishing-related procedures, storage-related procedures, transfer procedures, cleaning-related procedures, rework-related procedures, oxidation-related procedures, nitridation-related procedures, or external processing elements, or any combination thereof.

Operational state data can be established for the subsystems (110, 120, 130, 140, 150, 160, and 170) and can be used and/or updated by MLMIMO-related processing sequences. In addition, operational state data can be established for the transfer/storage elements (112, 122, 132, 142, 152, and 162), processing elements (113, 123, 133, 143, 153, and 163), and evaluation elements (115, 125, 135, 145, 155, and 165), and can be updated by MLMIMO-related procedures. For example, the operational state data for the processing elements can include availability data, matching data for the processing elements, expected processing times for some process steps and/or sites, yield data, confidence data and/or risk data for the processing elements, or confidence data and/or risk data for one or more MLMIMO-related procedures. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include microprocessors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time MLMIMO-related procedures. A controller can receive real-time data from a MLMIMO model to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the Manufacturing Execution Systems (MES) 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update a model and/or procedure currently being used for the substrate and/or lot. For example, the current layout can be examined using the updated model and/or procedure when the model and/or procedure can be updated before the current layout is examined. The current layout can be examined using a non-updated model and/or procedure when an update cannot be performed before the current layout is processed. In addition, formatted messages can be used when resists are changed, when resist models are changed, when processing sequences are changed, when design rules are changed, or when layouts are changed, In some examples, the MES 180 may be configured to monitor some subsystem and/or system processes in real-time, and factory level intervention and/or judgment rules can be used to determine which processes are monitored and which data can be used. For example, factory level intervention and/or judgment rules can be used to determine how to manage the data when a MLMIMO-related error condition occurs. The MES 180 can also provide modeling data, processing sequence data, and/or substrate data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL), and external subsystems and/or tools may be included. For example, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system.

The subsystems and/or processing elements can have different interface requirements, and the controllers can be configured to satisfy these different interface requirements.

One or more of the subsystems (110, 120, 130, 140, 150, 160, and 170) can perform control applications, Graphical User Interface (GUI) applications, and/or database applications. In addition, one or more of the subsystems (110, 120, 130, 140, 150, 160, and 170) and/or controllers (114, 124, 134, 144, 154, 164, and 190) can include Design of Experiment (DOE) applications, Advanced Process Control (APC) applications, Fault Detection and Classification (FDC) applications, and/or Run-to-Run (R2R) applications.

Output data and/or messages from MLMIMO modeling procedures can be used in subsequent procedures to optimize the process accuracy and precision. Data can be passed to MLMIMO-related procedures in real-time as real-time variable parameters, overriding current model values, and reducing DOE tables. Real-time data can be used with a library-based system, or regression-based system, or any combination thereof to optimize a MLMIMO-related procedure.

When a regression-based library creation procedure is used, measured MLMIMO model-related data can be compared to simulated MLMIMO model-related data. The simulated MLMIMO data can be iteratively generated, based on sets of process-related parameters, to obtain a convergence value for the set of process-related parameters that generates the closest match simulated MLMIMO model-related data compared to the measured MLMIMO model-related data. When a library-based process is used, a MLMIMO model-related library can be generated and/or enhanced using MLMIMO model-related procedures, recipes, profiles, and/or models. For example, a MLMIMO model-related library can comprise simulated and/or measured MLMIMO-related data and corresponding sets of processing sequence data. The regression-based and/or the library-based processes can be performed in real-time. An alternative procedure for generating data for a MLMIMO-related library can include using a machine learning system (MLS). For example, prior to generating the MLMIMO-related library data, the MLS can be trained using known input and output data, and the MLS may be trained with a subset of the MLMIMO-related library data.

MLMIMO models can include intervention and/or judgment rules that can be executed whenever a matching context is encountered. Intervention and/or judgment rules and/or limits can be established based on historical procedures, on the customer's experience, or process knowledge, or obtained from a host computer. Rules can be used in Fault Detection and Classification (FDC) procedures to determine how to respond to alarm conditions, error conditions, fault conditions, and/or warning conditions. The rule-based FDC procedures can prioritize and/or classify faults, predict system performance, predict preventative maintenance schedules, decrease maintenance downtime, and extend the service life of consumable parts in the system. Various actions can take place in response to an alarm/fault, and the actions taken on the alarm/fault can be context-based, and the context data can be specified by a rule, a system/process recipe, a chamber type, identification number, load port number, cassette number, lot number, control job ID, process job ID, slot number and/or the type of data.

Unsuccessful procedures or processing sequences can report a failure when a limit is exceeded, and successful procedures can create warning messages when limits are being approached. Pre-specified failure actions for procedures errors can be stored in a database, and can be retrieved from the database when an error occurs. For example, MLMIMO-related procedures can reject the data at one or more of the sites for a substrate when a measurement procedure fails.

MLMIMO models can be used to create, modify, and/or evaluate isolated and/or nested structures at different times and/or sites. For example, gate stack dimensions and substrate thickness data can be different near isolated and/or nested structures, and gate stack dimensions and substrate thickness data can be different near open areas and/or trench array areas. A MLMIMO model can create optimized data for isolated and/or nested structures to update and/or optimize a process recipe and/or process time.

MLMIMO models can use end-point detection (EPD) data and process time data to improve the accuracy. When EPD data is used to stop an etching procedure, the EPD time data and the process rate data can be used to estimate the amount of etch and/or to estimate a thickness.

In various examples, MLMIMO model-related limits can be obtained by performing the MLMIMO model-related procedure in a "golden" processing chamber, can be historical data that is stored in a library, can be obtained by performing a verified deposition procedure, can be obtained from the MES 180, can be simulation data, and can be predicted data. Partial-Etch procedure limits can be obtained by performing the partial-etch procedure in a "golden" processing chamber, can be historical data that is stored in a library, can be obtained by performing a verified partial-etch procedure, can be obtained from the MES 180, can be simulation data, and can be predicted data partial-etch procedure limits can be obtained by performing the COR-etch procedure in "golden" processing chambers, can be historical data that is stored in a library, can be obtained by performing a verified partial-etch procedure, can be obtained from the MES 180, can be simulation data, and can be predicted data.

FIGS. 2A-2F show exemplary block diagrams of etching subsystems in accordance with embodiments of the invention.

Figure 2A:
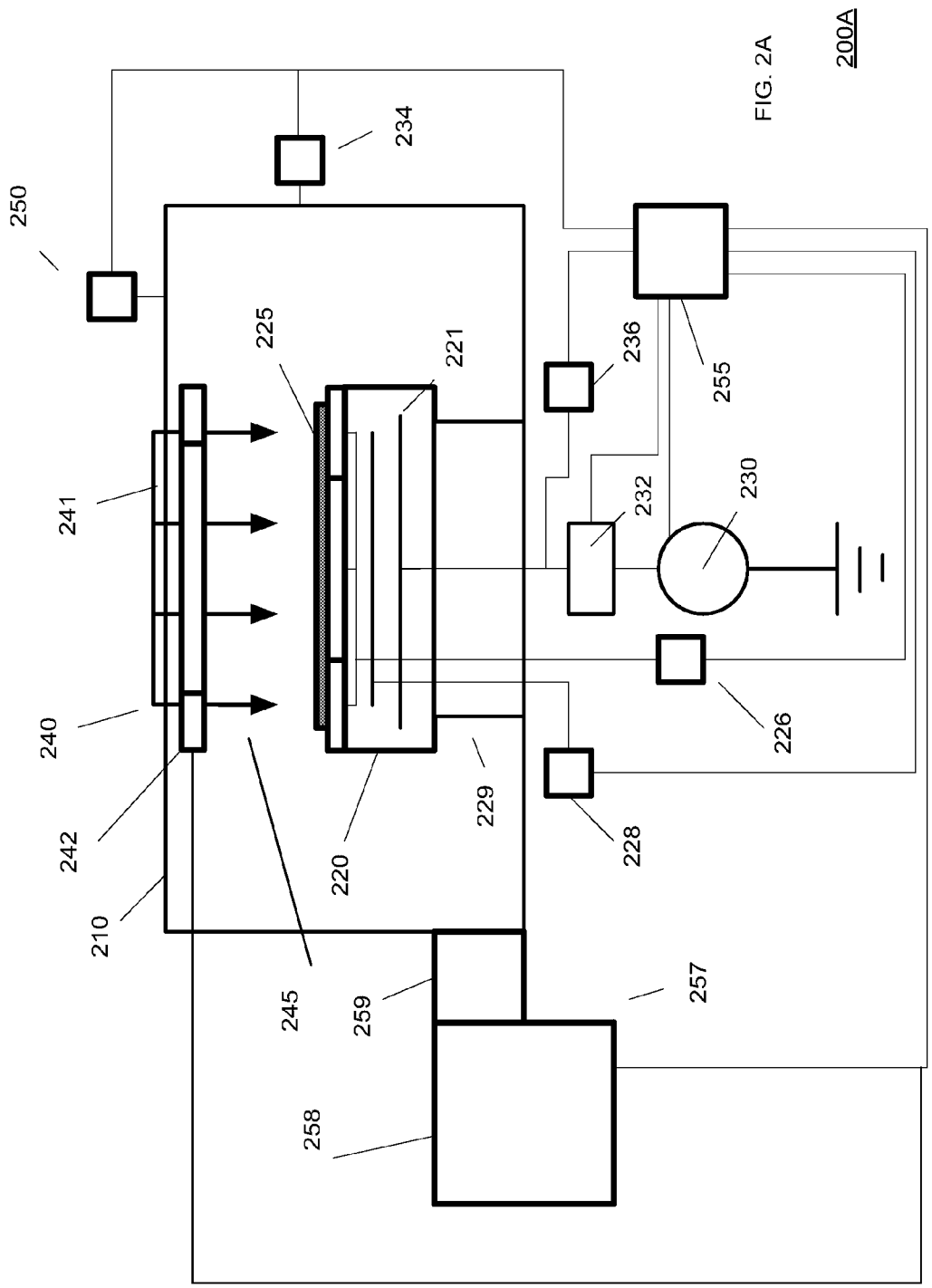

A first exemplary etching subsystem 200A is shown in FIG. 2A, and the illustrated etching subsystem 200A includes plasma processing chamber 210, substrate holder 220, upon which a substrate 225 to be processed is affixed, gas injection system 240, and vacuum pumping system 257. For example, substrate holder 220 can be coupled to and insulated from plasma processing chamber 210 using base 229. Substrate 225 can be, for example, a semiconductor substrate, a work piece, or a liquid crystal display (LCD). For example, plasma-processing chamber 210 can be configured to facilitate the generation of plasma in processing region 245 adjacent a surface of substrate 225, where plasma is formed via collisions between heated electrons and an ionizable gas. An ionizable gas or mixture of gases is introduced via gas injection system 240, and process pressure is adjusted. Desirably, plasma is utilized to create materials specific to a predetermined material process, and to aid either the deposition of material to substrate 225 or the removal of material from the exposed surfaces of substrate 225. For example, controller 255 can be used to control vacuum pumping system 257 and gas injection system 240.

Substrate 225 can be, for example, transferred into and out of plasma processing chamber 210 through a slot valve (not shown) and chamber feed-through (not shown) via robotic transfer system where it is received by substrate lift pins (not shown) housed within substrate holder 220 and mechanically translated by devices housed therein. After the substrate 225 is received from transfer system, it is lowered to an upper surface of substrate holder 220.

For example, substrate 225 can be affixed to the substrate holder 220 via an electrostatic clamping system (not shown). Furthermore, substrate holder 220 can further include a temperature control system 228. Moreover, gas can be delivered to the backside of the substrate via a dual (center/edge) backside gas system 226 to improve the gas-gap thermal conductance between substrate 225 and substrate holder 220. A dual (center/edge) backside gas system can be utilized when additional temperature control of the substrate is required at elevated or reduced temperatures. For example, temperature control of the substrate can be useful at temperatures in excess of the steady-state temperature achieved due to a balance of the heat flux delivered to the substrate 225 from the plasma and the heat flux removed from substrate 225 by conduction to the substrate holder 220. In other embodiments, heating elements, such as resistive heating elements, or thermoelectric heaters/coolers can be included.

As shown in FIG. 2A, substrate holder 220 includes a lower electrode 221 through which Radio Frequency (RF) power can be coupled to plasma in processing region 245. For example, lower electrode 221 can be electrically biased at an RF voltage via the transmission of RF power from RF generator 230 through impedance match network 232 to lower electrode 221. The RF bias can serve to heat electrons to form and maintain plasma. A typical frequency for the RF bias can range from 1 MHz to 100 MHz and is preferably 13.56 MHz.

Alternatively, RF power may be applied to the lower electrode 221 at multiple frequencies. Furthermore, impedance match network 232 serves to maximize the transfer of RF power to plasma in processing chamber 210 by minimizing the reflected power. Various match network topologies and automatic control methods can be utilized.

With continuing reference to FIG. 2A, process gas can be introduced to one or more areas of the processing region 245 through gas injection system 240. Process gas can, for example, include a mixture of gases such as argon, $CF_4$ and $O_2$, or argon, $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$, HBr. Gas injection system 240 can be configured to reduce or minimize the introduction of contaminants to substrate 225 and can include a gas injection plenum 241, and a multi-orifice showerhead gas injection plate 242. For example, process gas can be supplied from a gas delivery system (not shown). Gas injection system 240 can provide different flow rates to different regions of the processing region 245. Alternatively, gas injection system 240 may provide different process gasses to different regions of the processing region 245.

For example, vacuum pumping system 257 can include a turbo-molecular vacuum pump (TMP) 258 capable of a pumping speed up to 5000 liters per second (and greater) and a gate valve 259 for controlling the chamber pressure. In conventional plasma processing devices utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) may be coupled to the process chamber 210. The pressure-measuring device can be, for example, a Type 628B Baratron absolute capacitance manometer commercially available from MKS Instruments, Inc. (Andover, Mass.).

As depicted in FIG. 2A, etching subsystem 200A can include one or more sensors 250 coupled to plasma processing chamber 210 to obtain performance data, and controller 255 coupled to the sensors 250 to receive performance data. The sensors 250 can include both sensors that are intrinsic to the plasma processing chamber 210 and sensors extrinsic to the plasma-processing chamber 210. Intrinsic sensors can include those sensors pertaining to the functionality of plasma processing chamber 210 such as the measurement of the Helium backside gas pressure, Helium backside flow, electrostatic clamping (ESC) voltage, ESC current, substrate holder 220 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., C1 and C2 positions), a focus ring thickness, RF hours, focus ring RF hours, and any statistic thereof. Alternatively, extrinsic sensors can include one or more optical devices 234 for monitoring the light emitted from the plasma in processing region 245 as shown in FIG. 2A, and/or one or more electrical measurement devices 236 for monitoring the electrical system of plasma processing chamber 210 as shown in FIG. 2A. The optical devices 234 can include an optical sensor that can be used as an End Point Detector (EPD) and can provide EPD data. For example, an Optical Emissions Spectroscopy (OES) sensor may be used.

The electrical measurement device 236 can include a current and/or voltage probe, a power meter, or spectrum analyzer. For example, electrical measurement devices 236 can include a RF Impedance analyzer. Furthermore, the measurement of an electrical signal, such as a time trace of voltage or current, permits the transformation of the signal into frequency domain using discrete Fourier series representation (assuming a periodic signal). Thereafter, the Fourier spectrum (or for a time varying signal, the frequency spectrum) can be monitored and analyzed to characterize the state of a plasma. In alternate embodiments, electrical measurement device 236 can include a broadband RF antenna useful for measuring a radiated RF field external to plasma processing chamber 210.

Controller 255 includes a microprocessor, memory, and a digital I/O port (potentially including D/A and/or A/D converters) capable of generating control voltages sufficient to communicate and activate inputs to etching subsystem 200 as well as monitor outputs from etching subsystem 200. As shown in FIG. 2A, controller 255 can be coupled to and exchange information with first RF generator 230, impedance match network 232, gas injection system 240, vacuum pumping system 257, backside gas delivery system 226, temperature control system 228, optical device 234, electrical measurement device 236, and sensors 250. A program stored in the memory is utilized to interact with the aforementioned components of an etching subsystem 200 according to a stored process recipe.

In the exemplary embodiment shown in FIG. 2B, the etching subsystem 200B can be similar to the embodiment of FIG. 2A and further comprise either a stationary, or mechanically or electrically rotating magnetic field system 260, in order to potentially increase plasma density and/or improve plasma processing uniformity, in addition to those components described with reference to FIG. 2A. Moreover, controller 255 can be coupled to magnetic field system 260 in order to regulate the speed of rotation and field strength. The design and implementation of a rotating magnetic field is well known to those skilled in the art.

Figure 2B:
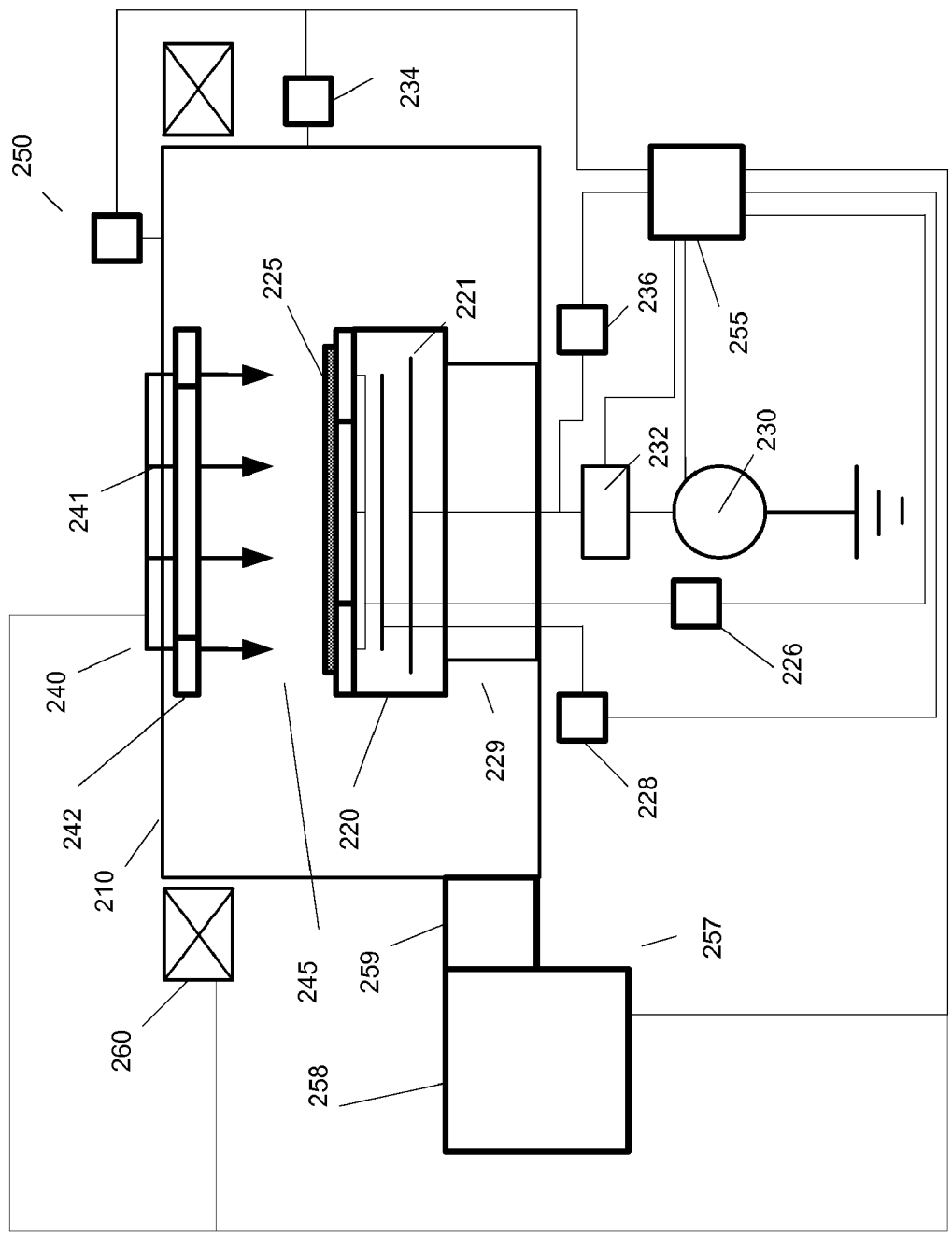
Figure 2C:
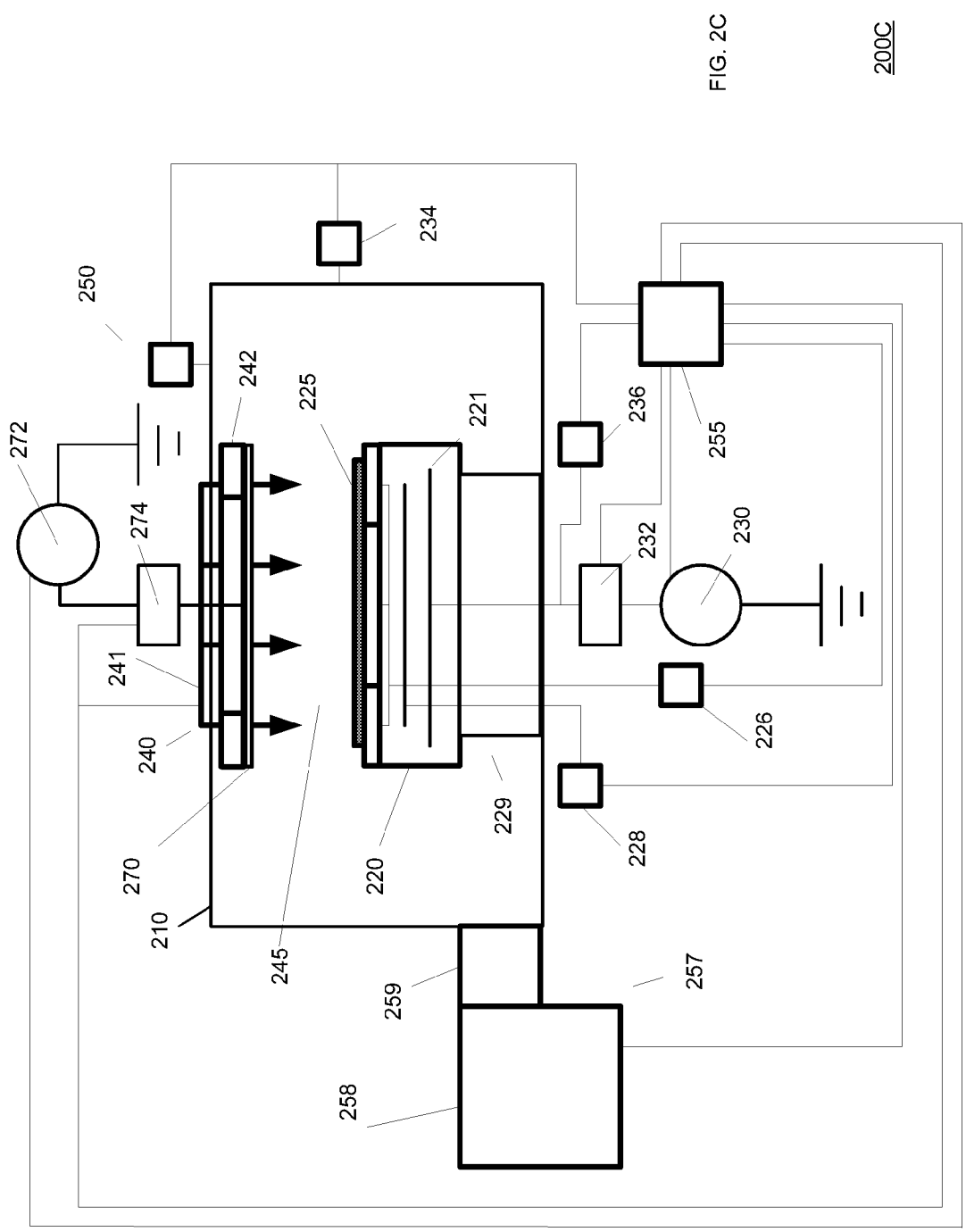

In the embodiment shown in FIG. 2C, the etching subsystem 200C can be similar to the embodiment of FIG. 2A or FIG. 2B, and can further comprise an upper electrode 270 to which RF power can be coupled from RF generator 272 through optional impedance match network 274. A frequency for the application of RF power to the upper electrode can range from about 0.1 MHz to about 200 MHz. Additionally, a frequency for the application of power to the lower electrode 221 can range from about 0.1 MHz to about 100 MHz. Moreover, controller 255 can be coupled to RF generator 272 and impedance match network 274 in order to control the application of RF power to upper electrode 270. The design and implementation of an upper electrode is well known to those skilled in the art. The upper electrode 270 and the gas distribution system 240 can be coupled to each other as shown.

Figure 2D:
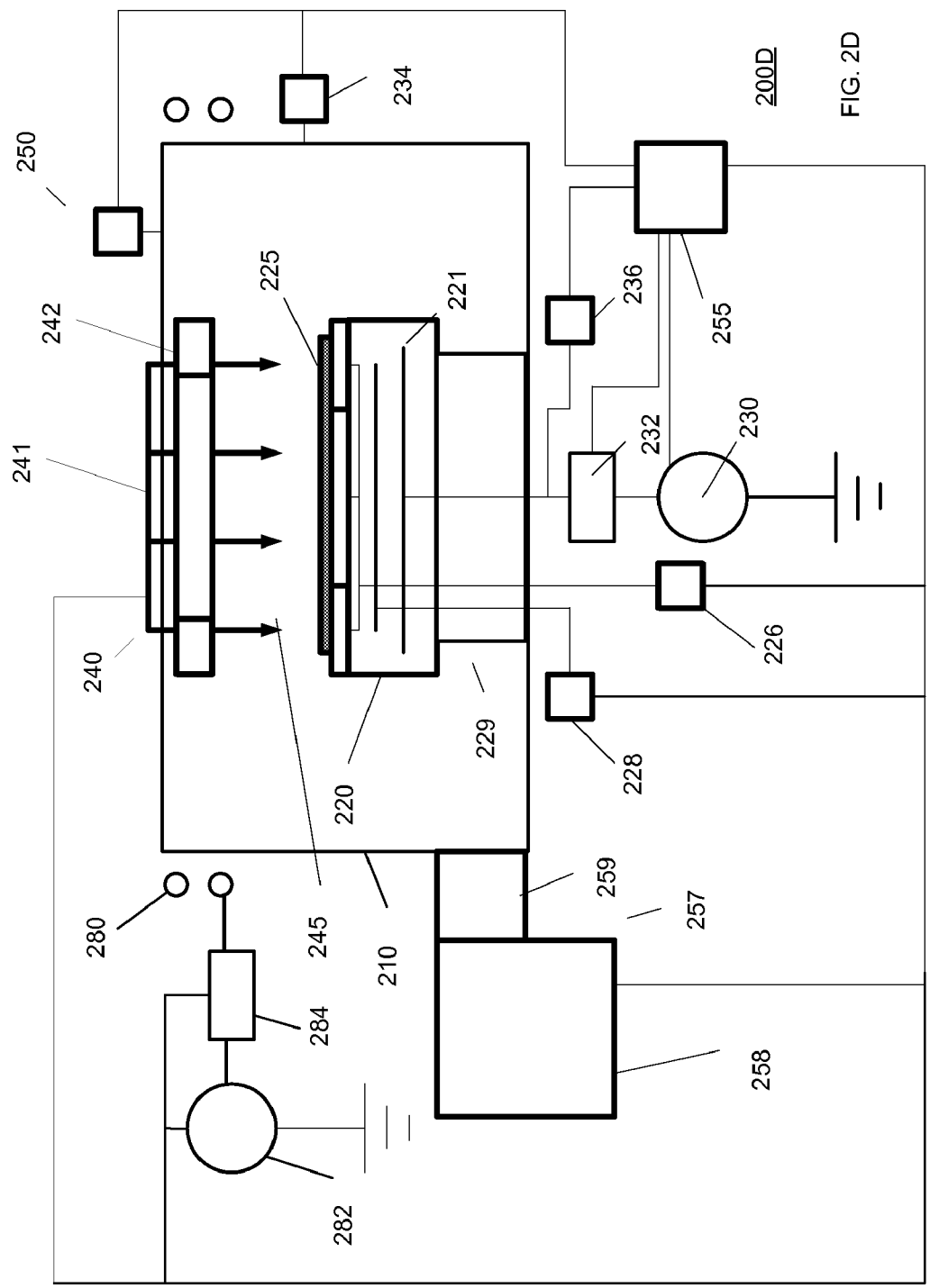

In the embodiment shown in FIG. 2D, the etching subsystem 200D can be similar to the embodiments of FIGS. 2A and 2B, and can further comprise an inductive coil 280 to which RF power can be coupled via RF generator 282 through optional impedance match network 284. RF power is inductively coupled from inductive coil 280 through a dielectric window (not shown) to plasma processing region 245. A frequency for the application of RF power to the inductive coil 280 can range from about 10 MHz to about 100 MHz. Similarly, a frequency for the application of power to the lower electrode 221 can range from about 0.1 MHz to about 100 MHz. In addition, a slotted Faraday shield (not shown) can be employed to reduce capacitive coupling between the inductive coil 280 and plasma. Moreover, controller 255 can be coupled to RF generator 282 and impedance match network 284 in order to control the application of power to inductive coil 280.

In an alternate embodiment (not shown), is a "spiral" coil or "pancake" coil configuration may be used for the inductive coil. The design and implementation of an inductively coupled plasma (ICP) source, or transformer coupled plasma (TCP) source, is well known to those skilled in the art.

Figure 2E:
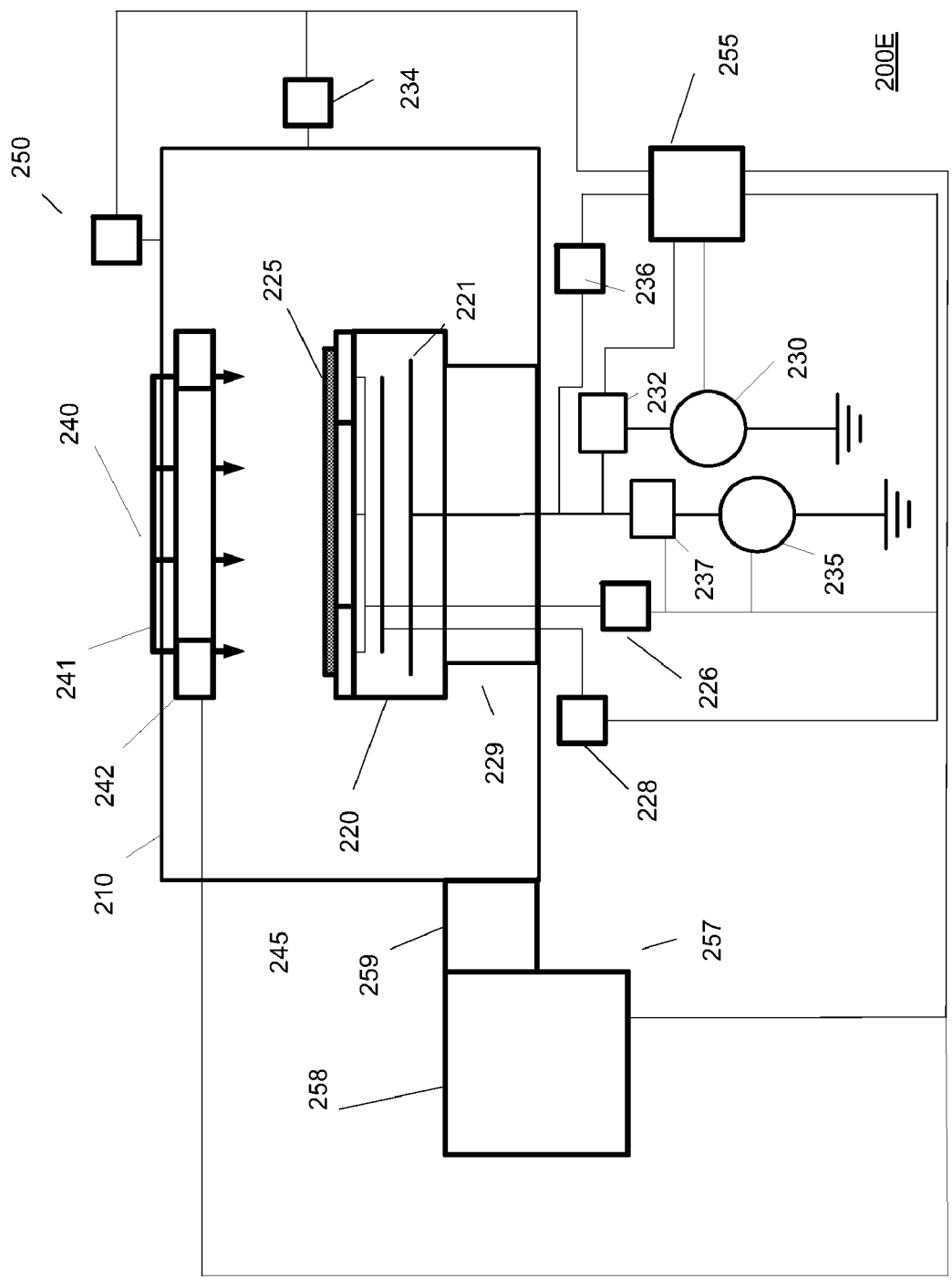
Figure 3A:
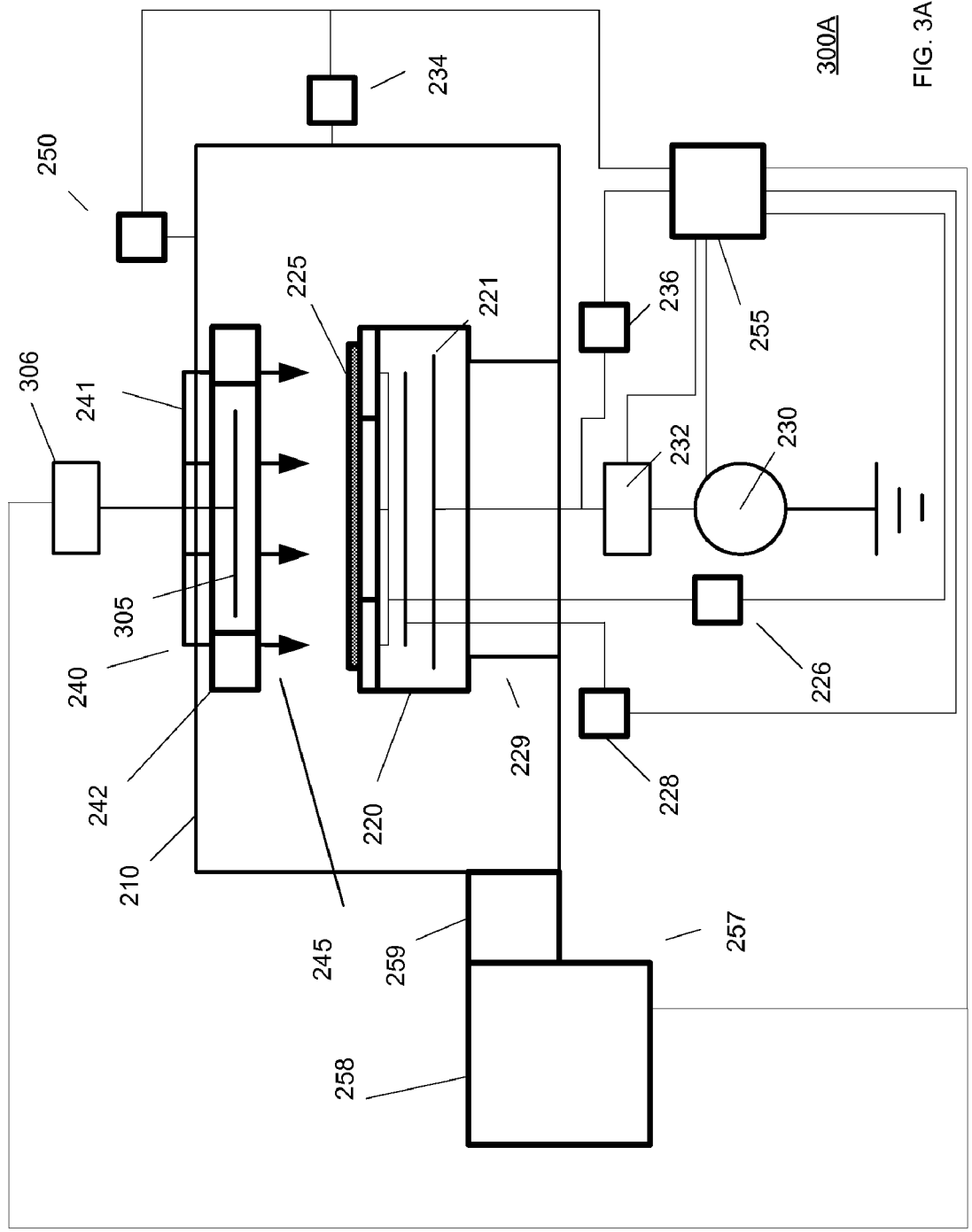
Figure 3B:
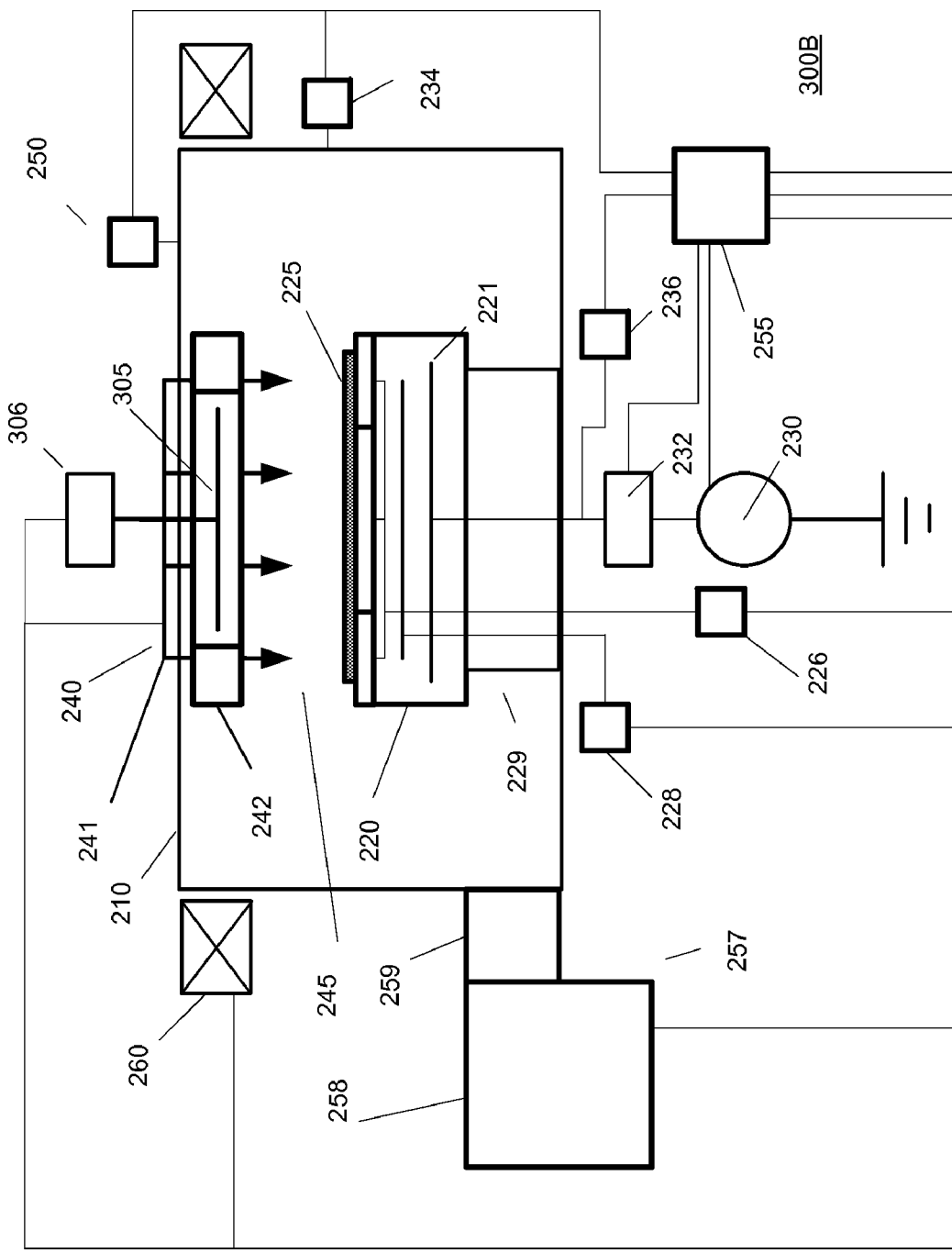
Figure 3D:
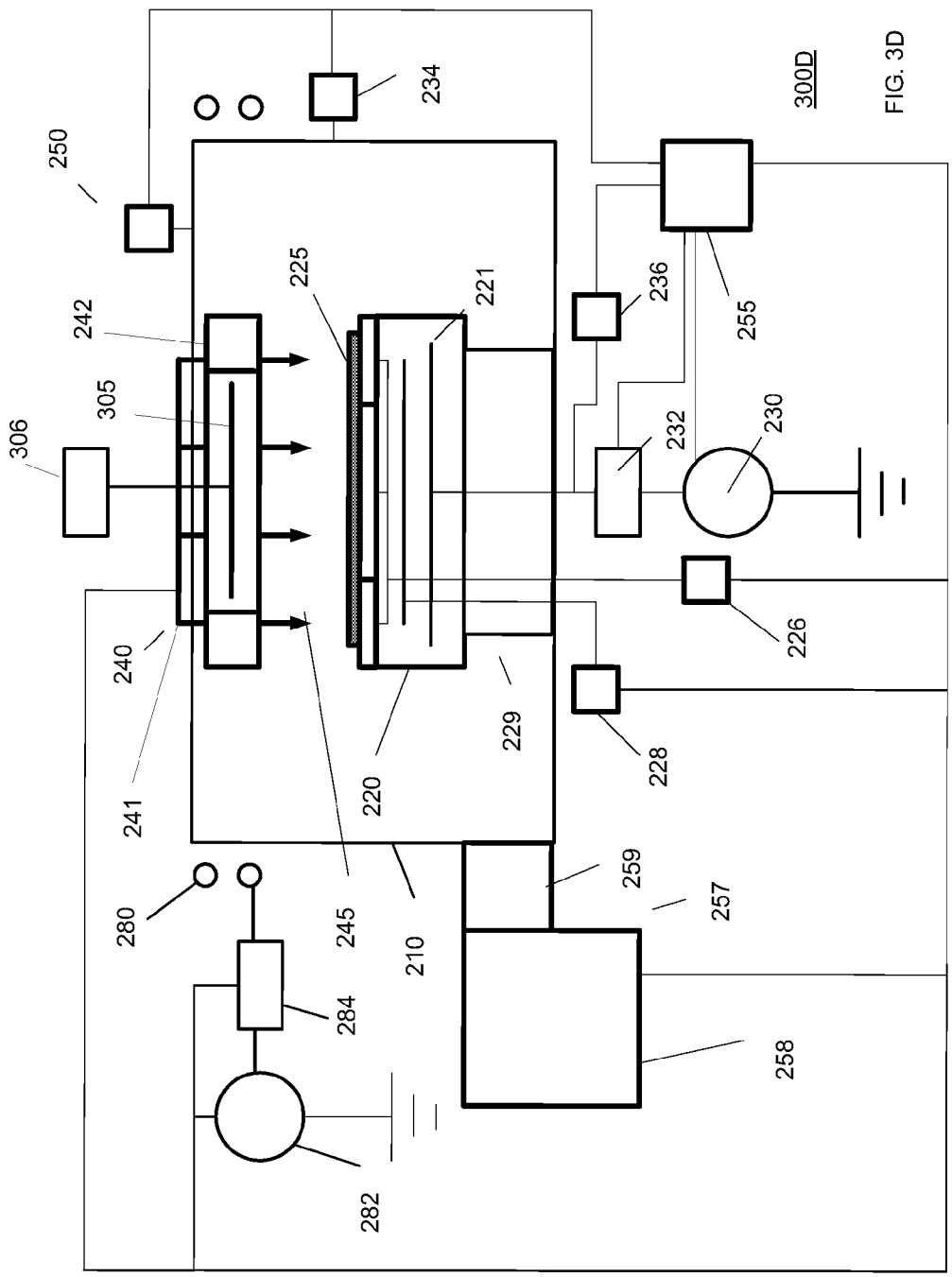
Figure 3E:
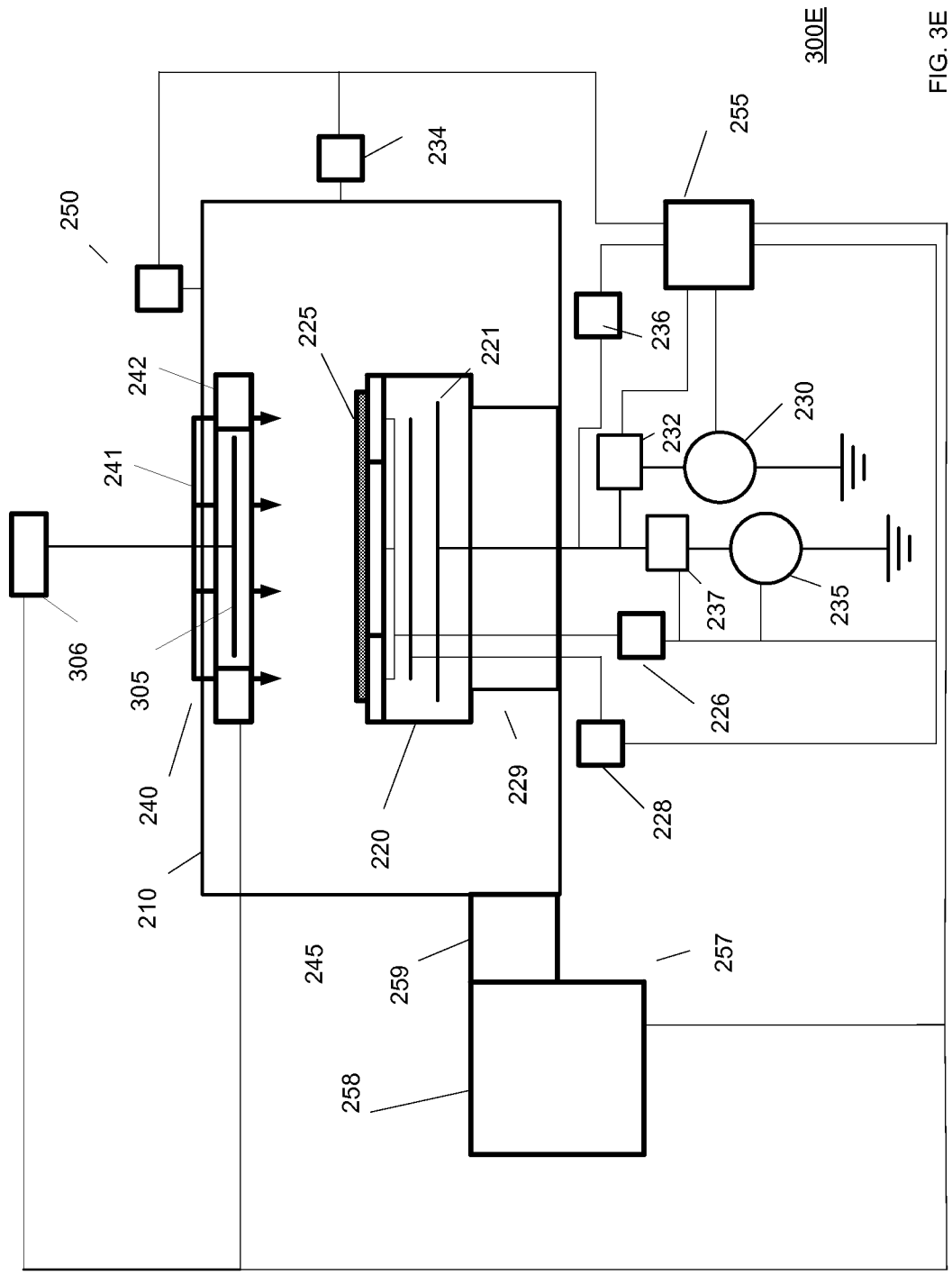
Figure 3F:
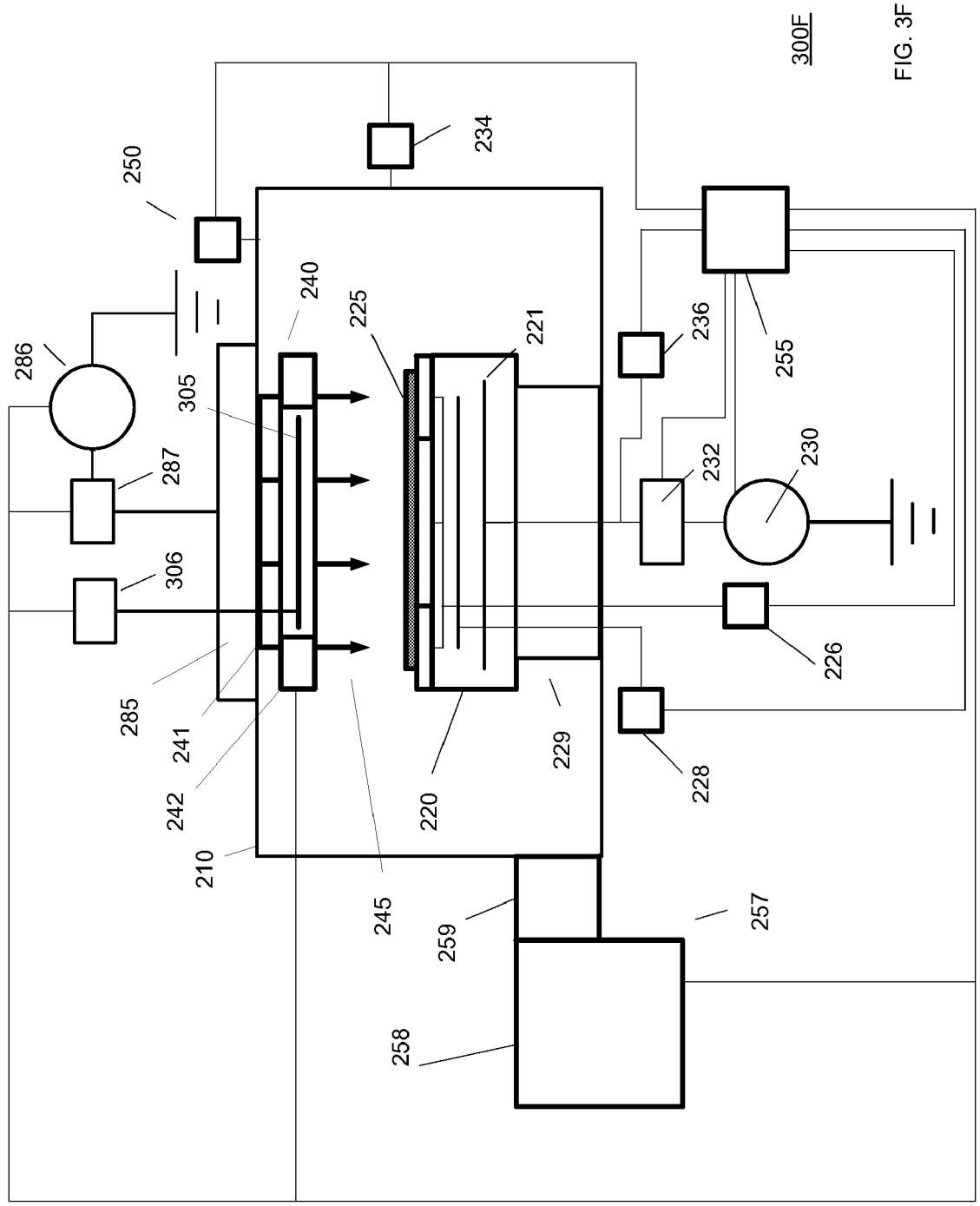

In the embodiment shown in FIG. 2E, the etching subsystem 200E can, for example, be similar to the embodiments of FIGS. 2A, 2B, 2C, and 2D, and can further comprise a second RF generator 235 configured to couple RF power to substrate holder 220 through another optional impedance match network 237. A typical frequency for the application of RF power to substrate holder 220 can range from about 0.1 MHz to about 200 MHz for either the first RF generator 230 or the second RF generator 235 or both. The RF frequency for the second RF generator 235 can be relatively greater than the RF frequency for the first RF generator 230. Furthermore, the RF power to the substrate holder 220 from the first RF generator 230 can be amplitude modulated, the RF power to the substrate holder 220 from the second RF generator 235 can be amplitude modulated, or both RF powers can be amplitude modulated. Desirably, the RF power at the higher RF frequency is amplitude modulated. Moreover, controller 255 can be coupled to the second RF generator 235 and impedance match network 237 in order to control the application of RF power to substrate holder 220. The design and implementation of an RF system for a substrate holder is well known to those skilled in the art.

In the embodiment shown in FIG. 2F, the etching subsystem 200F can be similar to the embodiments of FIGS. 2A and 2E, and can further comprise a surface wave plasma (SWP) source 285. The SWP source 285 can comprise a slot antenna, such as a radial line slot antenna (RLSA), to which microwave power is coupled via microwave generator 286 through optional impedance match network 287.

FIGS. 3A-3F show additional embodiments for etching subsystems in accordance with embodiments of the invention. FIGS. 3A-3F illustrate exemplary etching subsystems 300A-300F that are similar to the exemplary etching subsystems 200A-200F shown in FIGS. 2A-2F, but etching subsystems 300A-300F include at least one DC electrode 305 and at least one DC source 306.

During patterned etching, a dry plasma etching process is often utilized, and the plasma is formed from a process gas by coupling electro-magnetic (EM) energy, such as radio frequency (RF) power, to the process gas in order to heat electrons and cause subsequent ionization and dissociation of the atomic and/or molecular composition of the process gas. In addition, negative, high voltage direct current (DC) electrical power can be coupled to the plasma processing system in order to create an energetic (ballistic) electron beam that strikes the substrate surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as US patent application no. 2006/0037701A1; the entire contents of which are herein incorporated by reference in their entirety. In general, the ballistic electron beam can be implemented within various types of plasma processing system, as shown in FIGS. 3A-3F.

The DC electrode 305 may comprise a silicon-containing material and/or a doped silicon-containing material. The DC source 306 can include a variable DC power supply. Additionally, the DC source 306 can include a bipolar DC power supply. The DC source 306 can further include a system configured to perform at least one of monitoring, adjusting, or controlling the polarity, current, voltage, and/or on/off state of the DC source 306. Once plasma is formed, the DC source 306 facilitates the formation of a ballistic electron beam. An electrical filter may be utilized to de-couple RF power from the DC source 306.

For example, the DC voltage applied to DC electrode 305 by DC source 306 may range from approximately –2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage.

In alternate embodiments, a Chemical Oxide Removal (COR) subsystem (not shown) can be used to remove or trim oxidized poly-Si material. In addition, the COR subsystem may be used to remove or trim an oxide masking layer. For example, a COR subsystem can comprise a chemical treatment module (not shown) for chemically treating exposed surface layers, such as oxide surface layers, on a substrate, whereby adsorption of the process chemistry on the exposed surfaces affects chemical alteration of the surface layers. Additionally, the COR subsystem can comprise thermal treatment module (not shown) for thermally treating the substrate, whereby the substrate temperature is elevated in order to desorb (or evaporate) the chemically altered exposed surface layers on the substrate.

Figure 4:
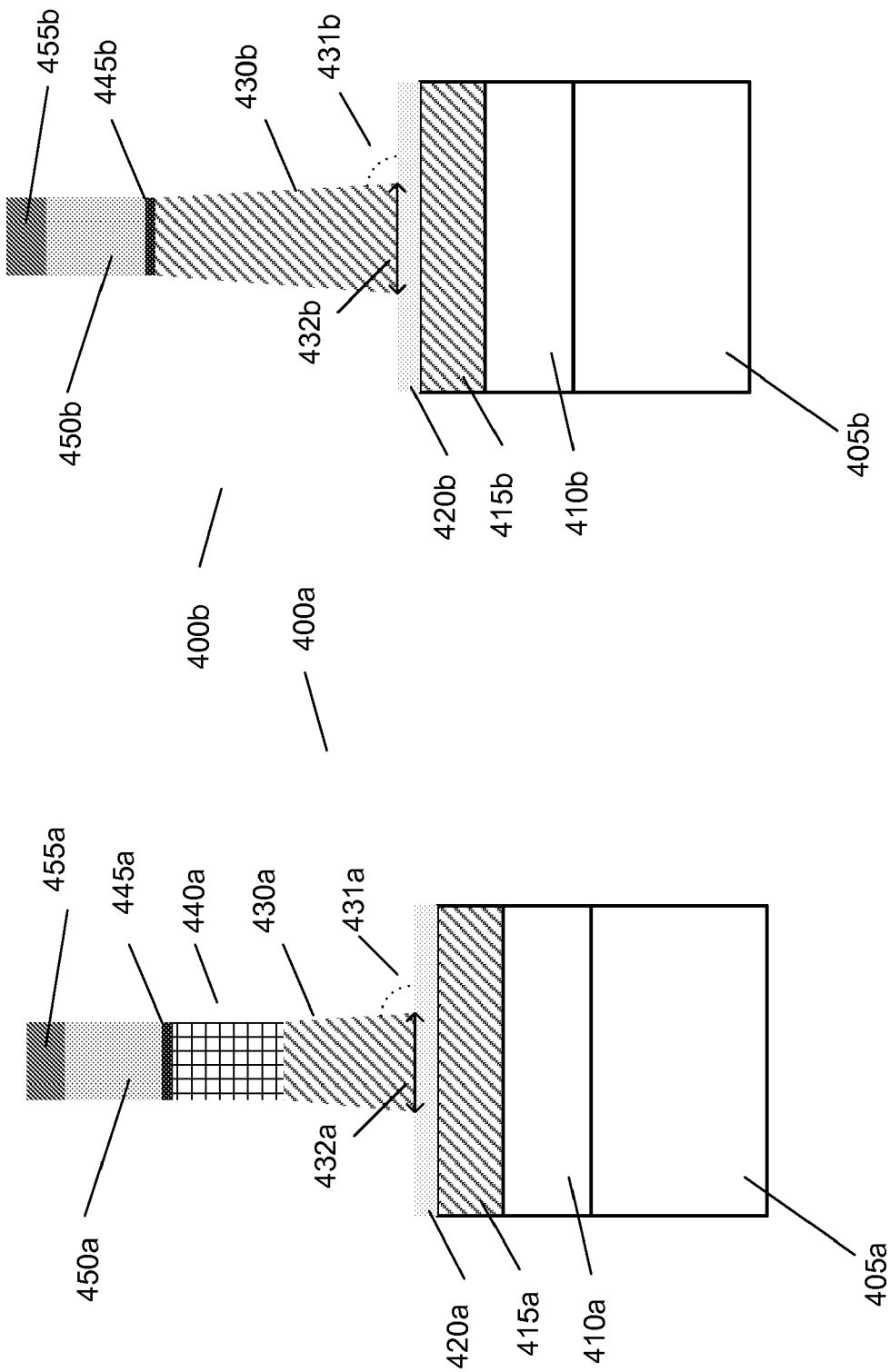
FIG. 4 illustrates an exemplary view of a Negative Channel Field Effect Transistor (nFET) structure and Positive Channel Field Effect Transistor (pFET) structure in accordance with embodiments of the invention.

FIG. 4 illustrates an exemplary view of a Negative Channel Field Effect Transistor (nFET) structure and Positive Channel Field Effect Transistor (pFET) structure in accordance with embodiments of the invention. FIG. 4 shows an exemplary gate stack for an nFET structure 400a and an exemplary gate stack for a pFET structure 400b. The exemplary gate stack for the nFET structure 400a can include a bulk silicon layer 405a, a buried oxide layer 410a, a silicon-on-insulator (SOI) layer 415a, a gate oxide layer 420a, a first poly-Si gate structure 430a, a doped poly-SI layer 440a, a nitride cap layer 445a, an oxide layer 450a, and a bottom antireflective coating (BARC) layer 455a. The first poly-Si gate structure 430a can have a first sidewall angle 431a and a first bottom CD 432a associated therewith, and the first bottom CD 432a can be associated with a gate length parameter and/or a gate width parameter. Alternatively, the first gate structure may be different, the number of layers may be different, and other materials may be used. The exemplary gate stack for the pFET structure 400b can include a bulk silicon layer 405b, a buried oxide layer 410b, a silicon-on-insulator (SOI) layer 415b, a gate oxide layer 420b, a second poly-Si gate structure 430b, a nitride cap layer 445b, an oxide layer 450b, and a bottom antireflective coating (BARC) layer 455b. The second poly-Si gate structure 430b can have a second sidewall angle 431b and second bottom CD 432b associated therewith, and the second bottom CD 432a can be associated with a gate length parameter and/or a gate width parameter. Alternatively, the first gate structure may be different, the number of layers may be different, and other materials may be used. In some embodiments, pre-processing data can be established for an MLMIMO sequence, and the exemplary gate stack can be measured before an MLMIMO sequence is performed. In other embodiments, pre-processing data can be established for an MLMIMO procedure using one or more patterned masking layers, and the one or more patterned masking layers can be measured before a gate stack is produced.

The sidewall angles (431a and 431b) can vary from approximately eighty degrees to approximately ninety degrees, and bottom CDs (432a and 432b) can vary between approximately 25 nm and 60 nm. The width of the gate oxide layers (450a and 450b) can vary between approximately 25 nm and 60 nm, the thickness of the nitride cap layers (445a and 445b) can vary between approximately 1 nm and 10 nm. The height of the gate structures (400a and 400b) can vary between approximately 125 nm and 160 nm.

Figure 5:
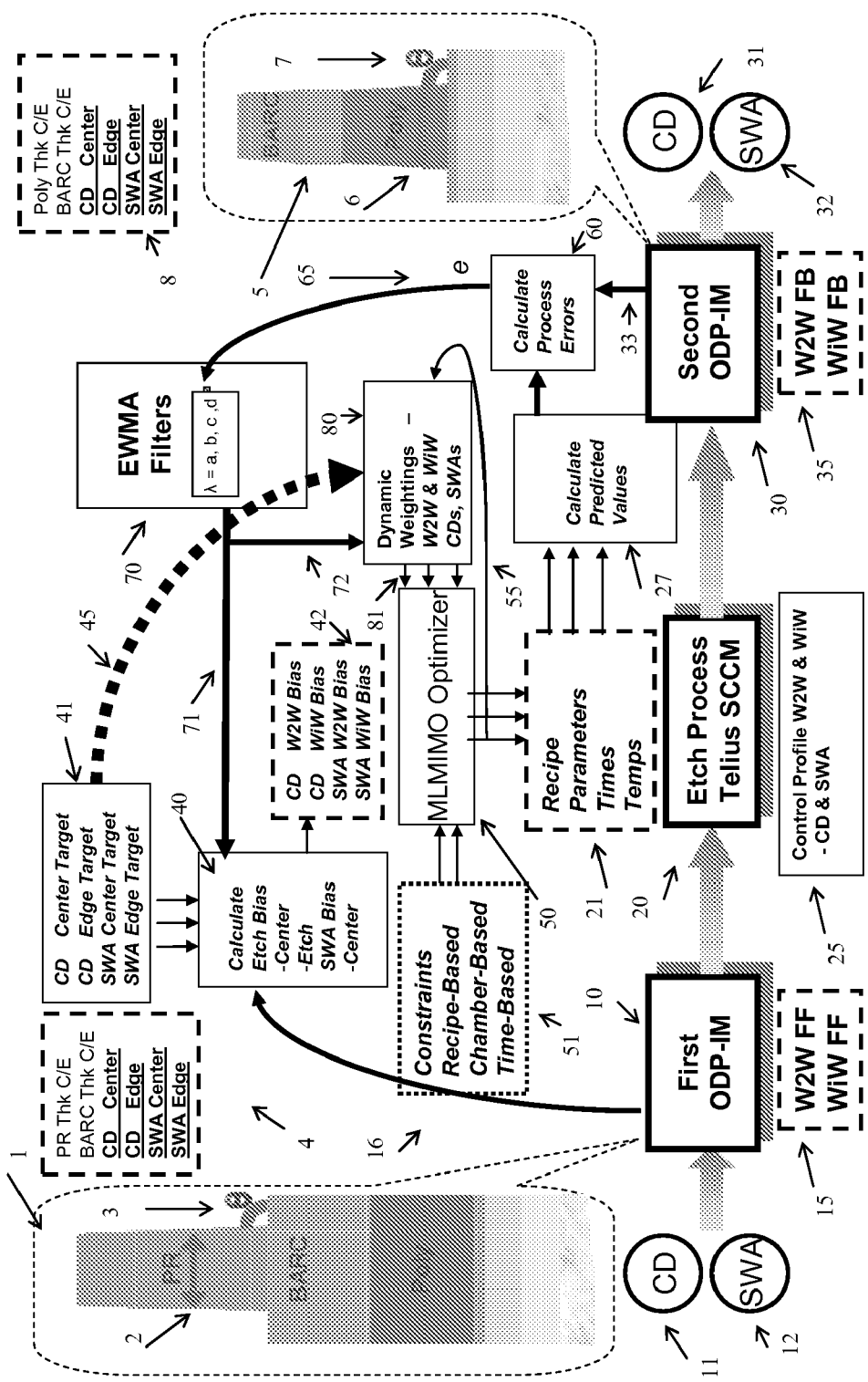
FIG. 5 shows a simplified block diagram of an exemplary Multi-Layer/Multi-Input/Multi-Output (MLMIMO) model optimization and control methodology in accordance with embodiments of the invention.

FIG. 5 shows a simplified block diagram of an exemplary Multi-Layer/Multi-Input/Multi-Output (MLMIMO) model optimization and control methodology in accordance with embodiments of the invention. In the illustrated MLMMIMO model methodology, exemplary images of a portion of a patterned photoresist (PR) stack 1 and a post-processed gate stack 5 are shown. The "PR" layer of the PR stack 1 can include one or more PR-layer CDs 2 and one or more PR-layer sidewall angles (SWAs) 3. The PR stack 1 can be characterized using a first set of parameters 4 that can include center and edge photoresist (PR C/E) data items, center and edge thickness (Thick C/E) data items, CD center data items, CD edge data items, SWA center data items, and SWA edge data items. Alternatively, a different set of parameters may be used. The "Poly" layer of the Gate stack 5 can include one or more Poly-layer CDs 6 and one or more Poly-layer SWAs 7. The Gate stack 5 can be characterized using a second set of parameters 8 that can include center and edge "Poly" (Poly C/E) data items, center and edge BARC (BARC C/E) data items, CD center data items, CD edge data items, SWA center data items, and SWA edge data items. Alternatively, a different set of parameters may be used.

In the illustrated methodology, a first integrated metrology (IM) tool (First ODP-IM) controller/model 10 can be coupled to a one or more etch tool controllers/models 20, and one or more of the etch controller/models 20 can be coupled to one or more second metrology tool (Second ODP-IM) controllers/models 30. The first metrology tool (First ODP-IM) controller/model 10 can receive CD data 11 and SWA data 12 and can provide feed forward data 15. The second metrology tool (First ODP-IM) controller/model 30 can send CD data 31 and SWA data 32 and can provide feed back data 35. In some examples, wafer-to-wafer feed-forward data (W2W FF) 15 can be associated with the First ODP-IM controller/model 10, and wafer-to-wafer feed-back data (W2W FB) 35 can be associated with the Second ODP-IM controller/models 30. In addition, one or more of the etch controller/models 20 can be used 25 to control gate stack profiles on a wafer-to-wafer (W2W) basis and to control gate stack profiles on a Within-Wafer (WiW) basis.

Data items 16 can be sent to a first calculation element 40 that can be used to calculate the etch bias at the center of the substrate and at the edge of the substrate. The first calculation element 40 can be used to calculate the SWA bias at the center of the substrate and at the edge of the substrate. A first set of target parameters 41 can be provided to the first calculation element 40, and a second set of filter outputs 71 can be provided to the first calculation element 40. Output data items 42 from the first calculation element 40 can be provided to one or more MLMIMO model Optimizers 50.

One or more of the MLMIMO model Optimizers 50 can be provided with one or more constraint parameters 51 that can include tool limits, recipe limits, and/or time limits. In the example shown, the constraint parameters 51 can include step-based process gas limits. One or more of the MLMIMO model Optimizers 50 can determine one or more sets of recipe parameters 21 that can be sent to one or more of the etch tool controller/models 20.

One or more of the etch tool controller/models 20 can be used to calculate predicted data items 27 that can include one or more predicted etch biases, one or more predicted SWA biases, one or more predicted step times for one or more etch recipes, and one or more predicted process gas flows for one or more etch recipes.

One or more of the Second ODP-IM controller/models 30 can provide one or more actual outputs 33 to one or more comparison elements 60, and one or more of the actual outputs 33 can be compared to one of more of the predicted data items 27. One or more of the error values 65 from one or more of the comparison elements 60 can be provided to one or more of the EWMA filters 70

One or more of the EWMA filters 70 can provide one or more first filtered outputs 71 to the first calculation element 40, and one or more of the EWMA filters 70 can provide one or more second filtered outputs 72 to one or more of the weighting controller/models 80. Each of the EWMA filters 70 can filter and provide feedback data for a single parameter or error value. Alternatively, each of the EWMA filters 70 can filter and provide feedback data for a multiple parameters or error values. One or more of the weighting controller/models 80 can receive one or more target data items 45 and one or more feedback data items 55 from one or more of the MLMIMO model Optimizers 50. In addition, one or more of the weighting controller/models 80 can provide one or more dynamically varying weighting inputs 81 to one or more of the MLMIMO model Optimizers 50. The concept of using dynamic weightings based on the feedback error is to force the optimizer to prioritize the weightings (rebalance) with a goal of better control of the most important CVs—automation of a manual tuning of a control system in runtime.

Figure 6:
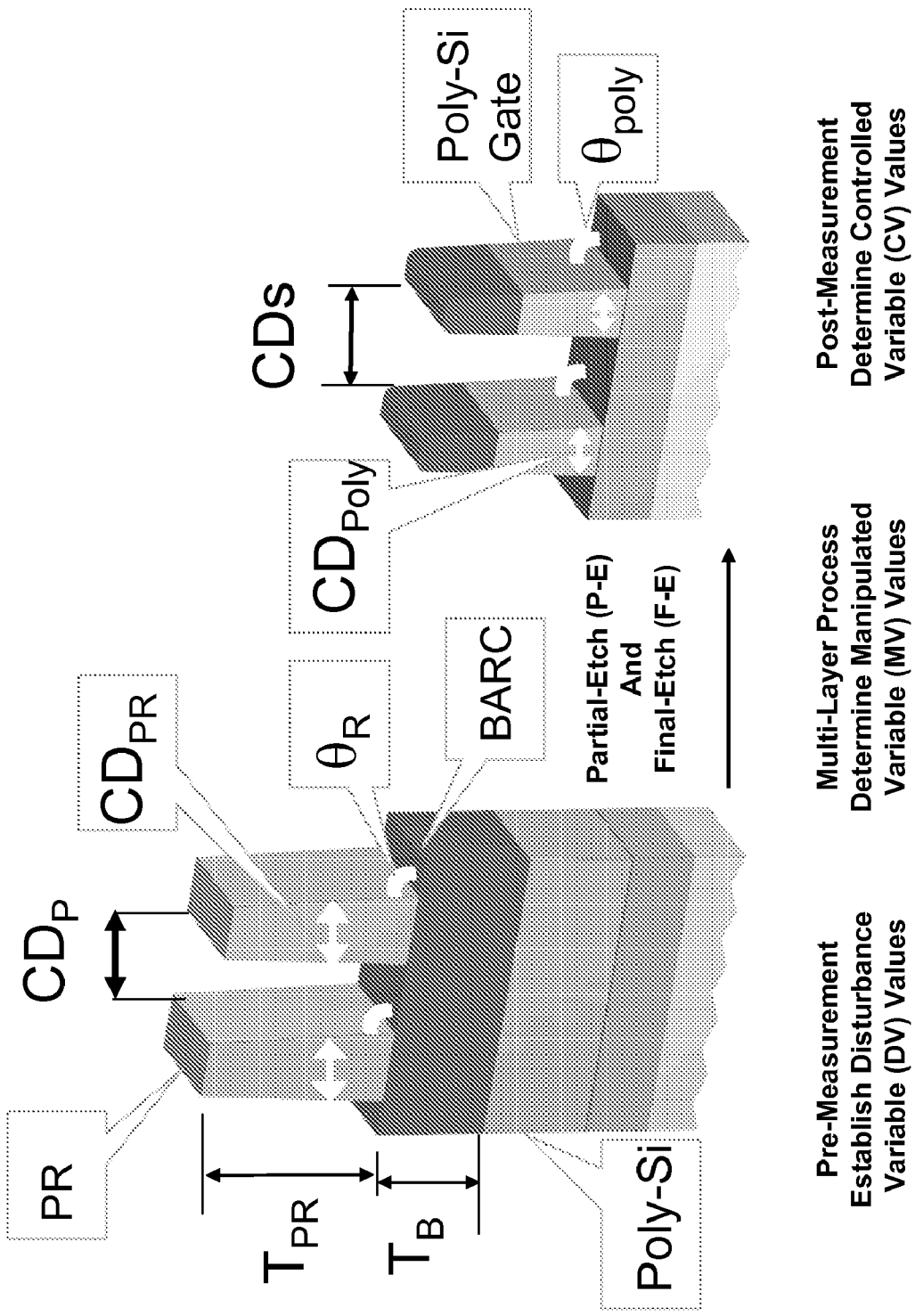
FIG. 6 illustrates a simplified block diagram of a multi-layer processing sequence in accordance with embodiments of the invention.

FIG. 6 illustrates a simplified block diagram of a multi-layer processing sequence in accordance with embodiments of the invention. FIG. 6 shows a simplified view of a multi-layer processing sequence and a number of critical measurements required for monitoring and controlling pre-measurement procedures, Partial-Etch (P-E) procedures, Final-Etch (F-E) procedures, and post-measurement procedures. For example, gate CD control has evolved to include multiple input parameters, such as CD and sidewall angle (SWA) of the resist, as shown $CR_{PR}$ and $\theta_R$ respectively, and the $CD_{PR}$ and $CD_P$ will get smaller as semiconductor devices continue to shrink.

As the devices shrink, the process windows become smaller and variations such as SWA, film thicknesses, and CD that were previously assumed to be independent of each other are now interacting with each other and this interaction requires multivariate process control methods and models. Advanced model-based multivariable control technology can be established for plasma etching, and steady state and dynamic mathematical models of an etching process can be developed during process development. The models can be based on the physics and chemistry associated with the etching process and can provide valuable insight into the complex interactions among the process variables in multiple layers that directly affect the electrical performance of the devices. For multi-layer processes, one or more controlled variables (CV) can be related to one or more measured parameters (CD, SWA, depth etc). For example, some CVs can be used to maintain substrate uniformity and line density sensitivity. Controlling etch profile and line width requires adjusting more than one recipe parameter (step time, gas flow, pressure etc.), referred to as manipulated variables (MV) for both center and edge profile control. To address profile and uniformity control the system requires a multilayer/multi-input/multi-output (MLMIMO) approach that includes interaction terms for CVs, Disturbance Variables (DVs), and MVs.

When a MLMIMO model and the associated closed loop etch process controller are being developed, an analysis of the incoming data can be performed. Sources of profile variation from a lithography tool can be examined using a first set of parameters related to the shape of a patterned resist feature that can include thickness, nominal CD, and side wall angle. In addition, other sets of parameters can include optical data, reflectivity data, transmission data, diffraction data, underlying layer data, etc.

In some examples, the resist thickness (height) $T_{PR}$ can be thick enough to provide the etch resistance needed and thin enough to provide good imaging quality. CD swing curve effects can also narrow the resist thickness operating control limits. In addition, the height of the patterned feature can be dependent upon the un-patterned resist thickness minus the erosion from developer dark loss and low level exposure light intensity. Coater spin speed adjustments can be used to correct for the mean resist thicknesses variations. Integrated metrology tools can be used to monitor patterned resist height $T_{PR}$ and BARC thickness $T_B$.

Post-litho develop inspect CD (DICD) control can be used to ensure post etch final inspect CD (FICD) control, and is typically monitored locally, across field, and globally. In some cases, local and across field CD variations can be dominated by mask and exposure effects, and global CD variations can be caused by scanner, track, and etch tools. Periodic tool optimization to create uniform dose maps and Post Exposure Bake (PEB) temperature profiles can be performed to ensure low across-substrate DICD variations. In addition, field by field dose adjustment maps can be used to correct for post etch CD uniformity, and multi-zone PEB offset adjustments can be used to optimize Within-Wafer (WiW) and Wafer-to-Wafer (W2W) level control of CD uniformity. Furthermore, photoresist SWA can affect the FICD, and the SWA variation can attributed to exposure tool focus variation.

Figure 7:
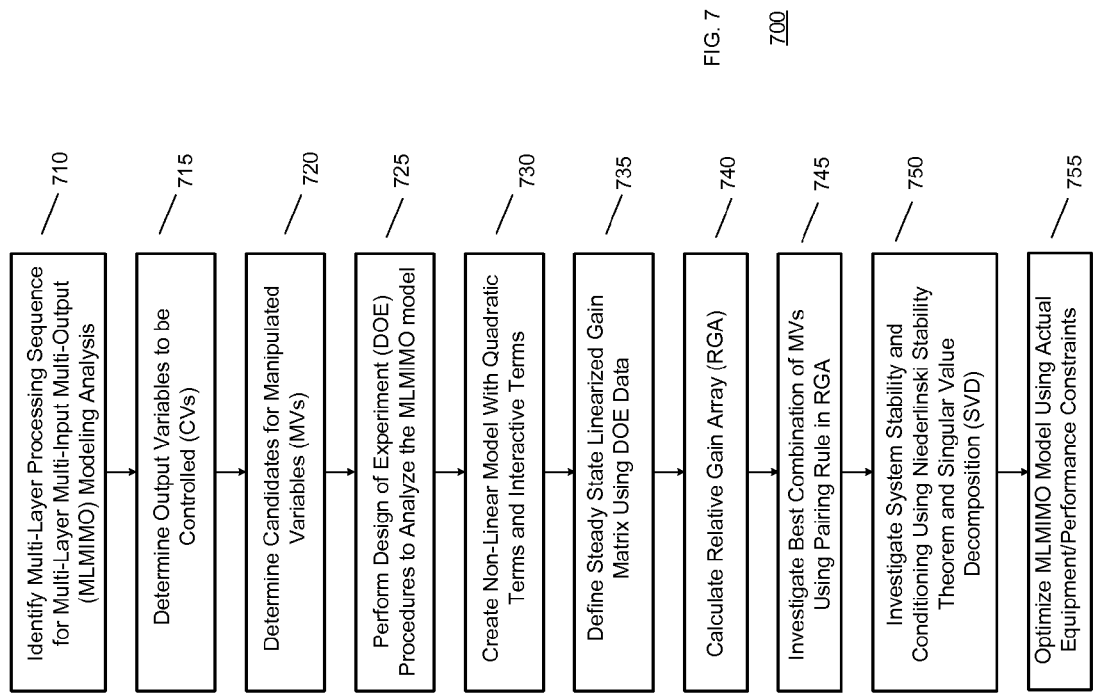
FIG. 7 illustrates an exemplary flow diagram for a procedure for developing a Multi-Layer/Multi-Input/Multi-Output (MLMIMO) model in accordance with embodiments of the invention.

FIG. 7 illustrates an exemplary flow diagram for a procedure for developing a Multi-Layer/Multi-Input/Multi-Output (MLMIMO) model in accordance with embodiments of the invention. In the illustrated embodiment, a procedure 700 is shown having a number of steps. Alternatively, a different number of alternate steps may be used.

In 710, one or more multi-layer processing sequences can be identified as candidates for a Multi-Layer/Multi-Input/Multi/Output modeling analysis procedure. In some examples, one or more MLMIMO models can be established to create one or more multi-layer gate structures (400a and 400b, FIG. 4).

In 715, a first set of controlled outputs variables (CVs) and the ranges associated with the CVs can be determined. One or more of the CVs can be specified by an end user or a customer. The CVs can include one or more critical dimensions (CDs) and/or one or more side wall angles associated with one or more of the multi-layer gate structures (400a and 400b, FIG. 4). In some example, a final etch sequence can be performed that includes one or more Partial-Etch (PE) procedures and one or more Final Etch (FE) procedures. For example, a final etch sequence can be performed to finalize one or more portions of the gate stack, and different final etch sequences can be performed for pFET devices, nFET devices, Tri-gate devices, and FinFET devices.

In 720, a first set of candidates can be determined for the manipulated variables (MVs) associated with the MLMIMO using one or more candidate recipes. The MVs can include WiW manipulated variables (WiW-MVs), and the WiW-MVs can include "fast" MVs that can be controlled while a substrate is being processed. The MVs can include W2W manipulated variables (W2W-MVs), and the W2W-MVs can include "slow" MVs that can be controlled when a wafer lot is being processed. The ranges for the MVs can be examined for each step in a candidate recipe.

In 725, Design of Experiment (DOE) procedures can be performed to analyze the MLMIMO model. Using physical analysis and engineering experience, design of experiments (DOE) procedures can be performed to establish statistical models that can connect MVs with each CV. If the number of experiments increases, a more accurate model can be obtained, but at the expense of additional materials and time. Therefore, cost and availability can limit the number of DOE substrates. In order to reduce them as much as possible but also prevent inaccuracy, a well designed DOE is of key importance. The most critical factor for such a DOE is the format of the predicted model. One or more model types can be selected, ranges can be provided for the CVs and/or MVs, and statistical software, such as JMP® (a statistical software from the SAS Institute) can be used to establish one or more of the DOE tables FIG. 8). An exemplary set of DOE data is shown in FIG. 8 that includes a first set of manipulated variables (MV-11, MV-12, and MV-13) that can be associated with a first etch procedure, a second set of manipulated variables (MV-21, MV-22, and MV-23) that can be associated with a second etch procedure, and a first set of controlled variables (CV-01, CV-02, CV-03, CV-04, CV-05, and CV-06). In other analysis procedures, other MVs and CVs can be used. The process modeling assumes the chamber state is stable between substrates and lots.

In some embodiments, the etching subsystem 200c shown in FIG. 2C can be used to generate an etching plasma. For example, the top source 272 can be operated at 60 MHz and a bottom source 230 can be operated at 13.56 MHz. In addition, the top source 272 power can vary from approximately 100 watts to approximately 700 watts and the bottom source 230 power can vary from approximately 10 watts to approximately 170 watts during the first Partial-Etch procedure and the first Final-Etch (F-E) procedure. During the Partial-Etch (partial etch) steps, $CF_4/O_2$ plasma can be used, and during the Final-Etch (poly-Si etch) steps, an $HBr/O_2$ plasma can be used. Using DOE procedures, poly-Si CD and SWA data was obtained to understand the effect of various process parameters (gas flows, pressure, temperature, power, etc.), and the data showed that the SWA of the photoresist has significant effect on SWA of poly-Si. For example, a higher SWA angle in the photoresist caused a higher SWA bias. During the Partial-Etch (partial etch) process, once the edge of the foot of the PR/ARC clears, etching of poly-Si starts. During the Final-Etch (poly-Si etch), process the photoresist profile (SWA) is transferred onto the poly-Si. For example, the $O_2$ flow rate can vary from approximately 2 sccm and approximately 10 sccm during the Final-Etch (poly-Si etch) process, and the $O_2$ flow rate can vary from approximately 3 sccm to approximately 20 sccm during the Partial-Etch (partial etch) process. In addition, the chamber pressure can vary from approximately 5 mTorr to approximately 40 mTorr during the Partial-Etch (partial etch) process and the Final-Etch (poly-Si etch) process and the center and edge temperatures can vary from approximately 45 degrees Celsius to approximately 66 degrees Celsius during the Partial-Etch (partial etch) process and the Final-Etch (poly-Si etch) process.

During the Partial-Etch (partial etch) process, $CF_4$ dissociates and produces $CF_x$ radicals and Fluorine atoms. The $CF_2$ radicals are responsible for polymer deposition on the PR surface and aids in anisotropic etching. $O_2$ dissociates to form Oxygen atoms, enabling atomic Oxygen and Fluorine atoms to isotropic etch the PR. During this step, the bottom electrode power is kept low so that ions do not contribute to the physical sputtering of PR. Since neutral species (Oxygen and Fluorine) have broad angular distribution, partial etch rate (resulting from atomic Oxygen and Fluorine flux) is higher at the "top" of the feature than the "bottom" of the feature. The top of the feature receives more neutral atoms compared to the bottom of the feature, causing tapering of PR lines during the Partial-Etch (partial etch) step. During these etch procedures, the partial etch rate (CD loss/CD bias), and tapering of sidewall (SWA bias) increased with the $O_2$ flow rate. During partial etch lines are etched from all directions by the bombarding Oxygen and Fluorine atoms. As the $O_2$ flow rate is increased with $CF_4$ flow rate kept constant, atomic Oxygen concentration increases, resulting in an increase of Oxygen flux to the substrate. The reaction rate of atomic Oxygen and Fluorine with the PR increases with higher temperature, which directly leads a higher etch rate of PR, and consequently to CD loss.

In a dual frequency, capacitively-coupled plasma, ion bombardment energy on the substrate is controlled by the lower frequency, and plasma density is controlled by the higher frequency. When the bottom electrode power is lower than the top electrode power, ion, and neutral flux depends mostly on the top electrode power. Since velocity of ions striking the substrate is anisotropic, most of the ions bombard the feature-bottom and top of the feature. Very few ions strike the sidewalls of PR. Since PR etch is essentially isotropic etched, CD loss does not depend on bottom electrode power. However, the etch rate of feature-bottom and top of the feature exposed to the plasma are bombarded with the ions. The vertical etch rate of these areas of the feature increases with bottom electrode power. Simultaneously more material sputters away from the feature-bottom and re-deposits on the sidewalls of PR. This leads to the tapering of PR sidewalls. SWA bias increases with bottom electrode power.

During the Final-Etch (poly-Si etch) step, HBr/O2 chemistry can be used, and a bromine rich oxide-like passivation film can be formed on the sidewall as well as on the bottom of the feature. Ions bombard the bottom of the feature, removing the passivation film from the bottom, while leaving the passivation layer on the sidewalls intact (anisotropic etching). The concentration of $O_2$ used in this step affects both the SWA and CD. SWA bias increases with the $O_2$ flow rate during Final-Etch (poly-Si etch) step. For example, this can be attributed to the re-deposition of the passivation film that was sputtered away from the feature-bottom. Increasing the SWA also leads to a narrowing of the bottom CD.

During the Final-Etch (poly-Si etch) step, atomic Oxygen concentration increases with pressure, and the atomic Oxygen can passivate the sidewall of the feature. The thickness of passivation film increases with concentration of Oxygen. CD loss decreases with pressure during the poly-Si etch. The passivation layer is sputtered away from the bottom of the feature and can redeposit on the sidewalls. Therefore, SWA bias increases with pressure during poly-Si etch.

In addition, the processing time for the P-E procedure can vary from approximately 30 seconds to approximately 60 seconds, and the processing time for the F-E procedure can vary from approximately 30 seconds to approximately 300 seconds.

In 730, after performing the etch procedures required to populate one or more DOE tables, nonlinear models with quadratic and interaction terms can be created by using a least squares technique and statistical software. In some models, terms can be deleted that have extremely small coefficients associated with them.

In 735, one or more linear gain matrices (G) can be created using the DOE data. For example, $$\lambda ij = \frac{\left[\frac{\partial CV_i}{\partial MV_j}\right]_{MV_{k,k \neq j}}}{\left[\frac{\partial CV_i}{\partial MV_j}\right]_{CV_{k,k \neq j}}} = \frac{\text{Gain(open-loop)}}{\text{Gain(closed-loop)}}$$

for i=1, 2, ..., n and j=1, 2, ..., n. The symbol $(\partial CV_i/\partial MV_j)_{MV}$ denotes a partial derivative that is evaluated with all of the manipulated variables except $MV_j$ held constant, and this term is the open-loop gain between $CV_i$ and $MV_j$. In addition, the symbol $(\partial CV_i/\partial MV_j)_{CV}$ can be interpreted as a closed loop gain that indicates the effect of $MV_j$ and $CV_i$ when all of the control loops are closed.

If we start with a non-square matrix one goal is to eliminate some MV or CVs to make a square matrix. Many times and best, we have more MV's than CVs so we have a non-square matrix we use a non-square RGA. For example, $$\text{NRGA} = G \otimes (G^+)^T$$

The pseudo-inverse, $G^+$, is used instead of the normal inverse, $G^{-1}$. NRGA provides several criteria for the selection of a square system, but their criteria are not always valid in some non-square systems, so all combinations of square pairing of subsystems might need considered. To compare one subsystem with others RGA pairing rules can be used as a metric. This creates sub combinations that can then be compared for best square matrix.

In 740, one or more Relative Gain Arrays (RGA) can be calculated using one or more of the linear gain matrices (G). For example with square, $$\text{RGA} = G \otimes (G^{-1})^T$$

In 745, to investigate the best combinations of MV RGA analysis can be used for measured model parameter selection, and the best MVs can be determined for each CV using pairing rules in the RGA. For example, RGA elements can be selected such that their sum is closest to one. In addition, paring on negative elements can be avoided. In addition, the RGA analysis can be used to determine a number of candidate models and to identify the best case solution.

In 745, if you have more CVs than MVs, RGA Analysis can be used for selecting the most controllable CV (sensitivity analysis of CVs to MVs).

In 750, the system stability and conditioning can be determined. For example, the Niederlinski Stability Theorem states that a closed loop system resulting from diagonal pairing is unstable if:

$$NST = \frac{\det(G)}{\prod_{i=1}^{n} g_{ii}} < 0$$

where G is the gain matrix and $g_{ii}$ is the diagonal elements of the gain matrix. The condition of the gain matrix (G) can be determined using the following:

$$G = USV^T$$

where G, U, S, and V are matrices determined using singular value decomposition (SVD). In addition, a condition number (CN) can be determined using the ratio of the larger value to the smaller value in the S matrix. Additional information concerning the Niederlinski Theorem may be found in a book (ISBN 1852337761) entitled "Process Control: Theory and Applications" by Jean-Pierre Corriou which is incorporated herein in its entirety. For example, when CN is greater than fifty, the system is nearly singular and will have poor control performance.

In 755, the MLMIMO model can be optimized using actual equipment and/or performance constraints. In some examples, the measurement locations can be examined and selected to optimize performance, the number of pre- and/or post measurement procedure can be established to optimize performance, the multi-chamber sequences can be examined to optimize throughput. The feedback can be optimized by tuning the EWMA filters. The time constants for the MVs can be determined, and their update frequency can be based on Lot-to-Lot (L2L), W2W, WiW, and process step values. In addition, process center points, CV center points, and MV center points can be examined to optimize performance. Historical data can be used to perform simulations.

The substrates can include one or more layers that can include semiconductor material, carbon material, dielectric material, glass material, ceramic material, metallic material, oxidized material, mask material, or planarization material, or a combination thereof.

In other embodiments, one or more substrates can be processed using a verified MLMIMO model. When a verified MLMIMO model is used, one or more verified structures can be created on a substrate ("golden wafer"). When the substrate is examined, a test reference structure can be selected from a number of verified structures on the substrate. During the examination, examination data can be obtained from the test reference structure. A best estimate structure and associated best estimate data can be selected from the MLMIMO library that includes verified structures and associated data. One or more differences can be calculated between the test reference structure and the best estimate structure from the library, the differences can be compared to matching criteria, creation criteria, or product requirements, or any combination thereof. When matching criteria are used, the test reference structure can be identified as a member of the MLMIMO library, and the current substrate can be identified as a reference "golden" substrate if the matching criteria are met or exceeded. When creation criteria are used, the test reference structure can be identified as a new member of the MLMIMO library, and the current substrate can be identified as a verified reference substrate if the creation criteria are met. When product requirement data is used, the test reference structure can be identified as a verified structure, and the substrate can be identified as verified production substrate if one or more product requirements are met. Corrective actions can be applied if one or more of the criteria or product requirements are not met. MLMIMO-related confidence data and/or risk data can be established for the test reference structure using the test reference structure data and the best estimate structure data.

When MLMIMO-related structures are produced and/or examined, accuracy and/or tolerance limits can be used. When these limits are not correct, refinement procedures can be performed. Alternatively, other procedures can be performed, other sites can be used, or other substrates can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

In some embodiments, the MLMIMO evaluation library data can include goodness of fit (GOF) data, creation rules data, measurement data, inspection data, verification data, map data, confidence data, accuracy data, process data, or uniformity data, or any combination thereof.

Figure 9:
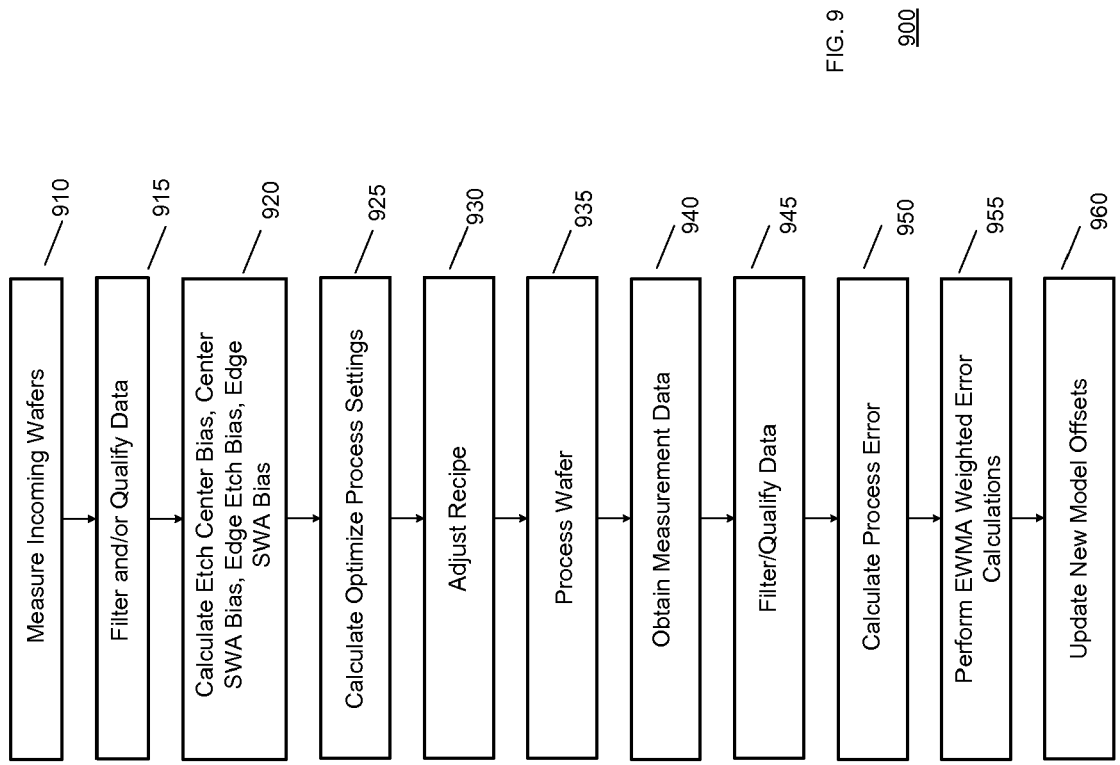
FIG. 9 illustrates a runtime flow diagram of a procedure for using a MLMIMO in accordance with embodiments of the invention.

FIG. 9 illustrates a runtime flow diagram of a procedure for using a MLMIMO in accordance with embodiments of the invention. When data is collected, a number of substrates can be used and candidate disturbance variables can be identified. During data collection, the variations associated with one or more CVs can be minimized, and the collected data can be used for a simulation. The simulation can execute the same sequence as the gate etch process used in production.

In 910, one or more substrates can be measured in an integrated metrology chamber and values for a first number (l) of disturbance variables D(l) can be obtained. In addition, other sensor data can be received and analyzed. The IM data can include CD and SWA data from multiple sites in a patterned masking layer on each incoming substrate. A second number (m) of manipulated variables MV(m) can be established.

In some embodiments, the incoming disturbance variables related to substrate state can be measured by using an IM tool, and the IM data can include profile data, CD data, SWA data, and BARC film thickness data at multiple sites across the substrate. For example, 8-10 center sites can be selected that can represent the center of the substrate, and 8-10 edge sites at the same radius can be selected that represent the edge radial signature and that can be optimum for etch control. The same number of sites can be selected for each area of the substrate to give the same weighting of accuracy to all areas. Grating density and transistor type should be selected to correlate to the most critical chip level performance metric (such as P or N channel transistor type) because each of the transistor structures can have some variations that can be related to the etch profile control needs.

The CD DV can be a critical DV and can have associated DVs that modify the measurement due to the mechanisms at work during the Partial-Etch (P-E) procedures. SWA can be a primary modifier that increases in sensitivity as the angle become less than ninety degrees, In addition, the middle CD can be used because it give the most accurate correlation to the final CD. Middle CD performs the best in simple terms because it averages the variation of the top and bottom CD measurements.

A second modifier of CD can be the BARC thickness variation across the substrate and water-to-wafer. BARC thickness can affect CD if the thickness is non-uniform because during the BARC etch the resist is continuing to be etched. A thinner BARC can give a shorter etch time, and thicker BARC can give a longer etch time, and a longer etch time will result in a smaller CD. Therefore, BARC non-uniformity can directly result in increased center to edge CD variation that will need to be modeled for control during the partial and final etch.

The IM data can be obtained after a development procedure, and the IM data can be obtained using as IM unit in a Lithography subsystem, an IM unit in an Etch subsystem, or a standalone IM unit.

In addition, sensor and state data can be used for DVs indicating a predicted plasma chamber state. For example, when lots (substrates) are being processed without using conditioning substrates, the chamber state can be affected by drift. Variations that contribute to chamber state feed forward DV can include events such as chamber cleans, parts replacements, chemical changes, idle time, conditioning substrates, chamber pause, manual adjustments, wafer substrate material changes, and product density changes.

In 915, the received data can be filtered and/or qualified. For example, the measurement DVs can be filtered using a box and whisker algorithm that eliminates sites that do not statically appear to be of the same population, and the remaining site can be averaged to represent the physical area of the substrate.

In 920, one or more of the CVs can be calculated and CDs, SWAs, uniformity values, and/or profile changes can be determined. In some examples, a third number (n) of control variables can be established using the following:

$$CV(n) = f_n\{MV(1), \ldots MV(m-1), MV(m), DV(1), \ldots DV(l-1), DV(l)\} + \text{offset}_n$$

where l, m, and n are integers that are greater than two.

Figure 10:
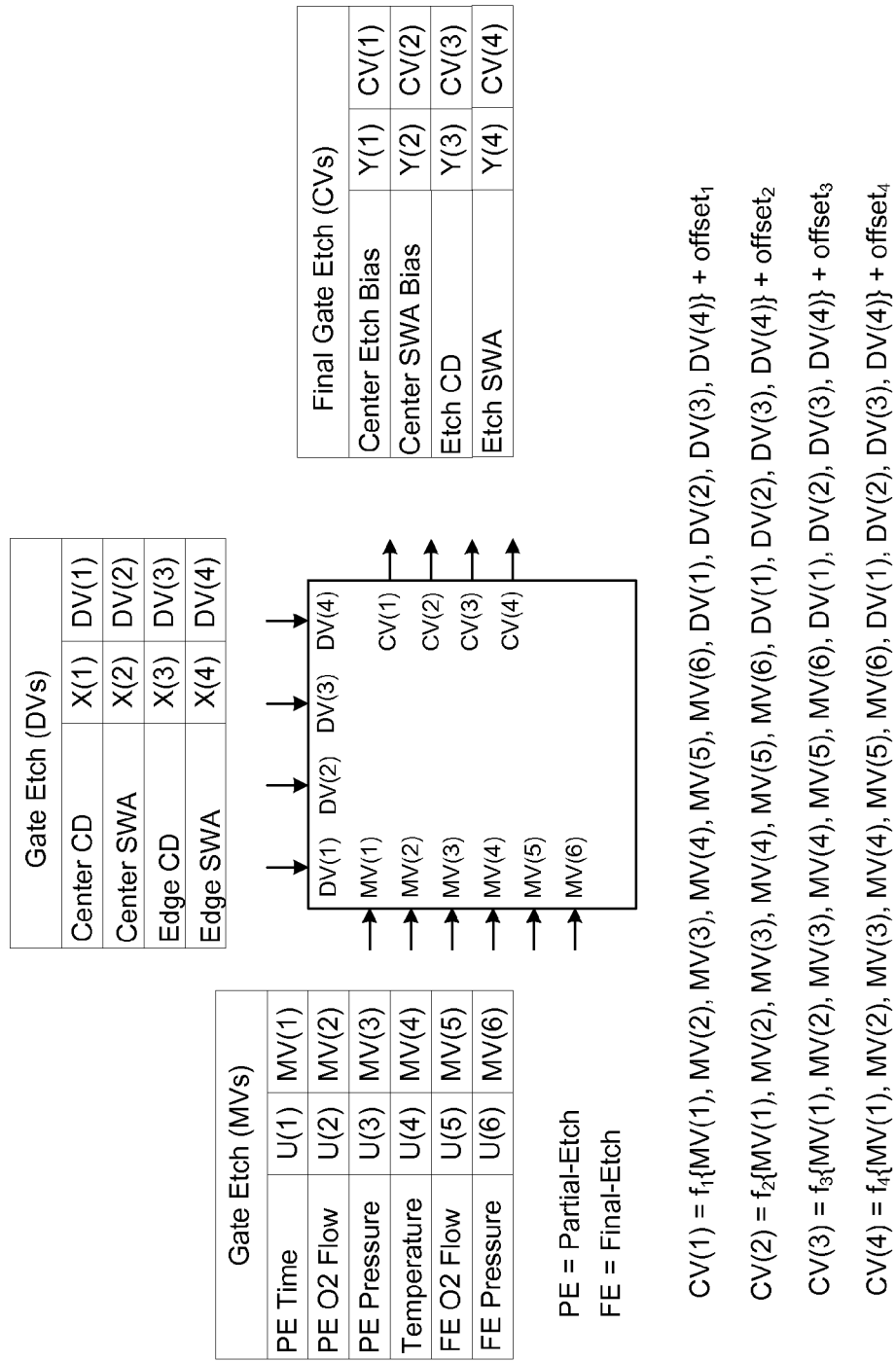
FIG. 10 illustrates an exemplary model associated with the runtime flow diagram of FIG. 9.

For example, when four CVs, six MVs, and four DVs have been identified as shown in FIG. 10, four non-linear models with higher order and interaction terms can be defined as:

$$CV(1) = f_1\{MV(1), MV(2), MV(3), MV(4), MV(5), MV(6), DV(1), DV(2), DV(3), DV(4)\} + \text{offset}_1$$

$$CV(2) = f_2\{MV(1), MV(2), MV(3), MV(4), MV(5), MV(6), DV(1), DV(2), DV(3), DV(4)\} + \text{offset}_2$$

$$CV(3) = f_3\{MV(1), MV(2), MV(3), MV(4), MV(5), MV(6), DV(1), DV(2), DV(3), DV(4)\} + \text{offset}_3$$

$$CV(4) = f_4\{MV(1), MV(2), MV(3), MV(4), MV(5), MV(6), DV(1), DV(2), DV(3), DV(4)\} + \text{offset}_4$$

In 925, optimized process settings can be calculated using a quadratic objective function, and target deviation CVs can be defined as:

$$t(n) = \{DV(l) - \text{target } CV(n)\}$$

when n=4 and l=4 the following equations can be obtained:

$$t(1)=\{DV(1)\text{-target }CV(1)\}$$

$$t(2)=\{DV(2)\text{-target }CV(2)\}$$

$$t(3)=\{DV(3)\text{-target }CV(3)\}$$

$$t(4)=\{DV(4)\text{-target }CV(4)\}.$$

Using the models and the target terms, a quadratic objective function that can be used for nonlinear programming can be defined as:

$$\min_{MV(1),MV(2),\overset{\dots}{MV}(n-1),MV(n)} \left\{ \begin{array}{l} \left(\frac{t(1)-CV(1)}{t(1)}\right)^2 w_1 + \\ \left(\frac{t(2)-CV(2)}{t(2)}\right)^2 w_2 \dots + \\ \left(\frac{t(n-1)-CV(n-1)}{t(n-1)}\right)^2 w_{j-1} + +\left(\frac{t(n)-CV(n)}{t(n)}\right)^2 w_j \end{array} \right\} \quad \text{Eq. 1}$$

and when n=4 the following simplified equation can be obtained $$\min_{MV(1),MV(2),MV(3),MV(4)} \left\{ \left(\frac{t(1)-CV(1)}{t(1)}\right)^2 w_1 + \left(\frac{t(2)-CV(2)}{t(2)}\right)^2 w_2 + \left(\frac{t(3)-CV(3)}{t(3)}\right)^2 w_3 + +\left(\frac{t(4)-CV(4)}{t(4)}\right)^2 w_4 \right\} \quad \text{Eq. 1a}$$

and the $w_j$ are weighting factors. In addition, the manipulated variables MV(l) can have upper and lower limits that can be included as inequality constraints and when (l=4) the following can be established:

$$a \leq MV(1) \leq b$$

$$c \leq MV(2) \leq d$$

$$e \leq MV(3) \leq f$$

$$g \leq MV(4) \leq h \quad \text{Eq. 2}$$

where a-h are constants that depend on the equipment constraints. The measured CD and SWA values can be used by the optimizer unit to calculate the MV, and the optimizer can determine the etch recipe by minimizing Eq. (1a) with Eq. (2) using nonlinear programming. For example, the MATLAB optimization toolbox can be used for this simulation.

In 930, a process recipe can be defined using one or more of the MVs established by the optimizer, and the process recipe can be adjusted using the new values for the MVs. Nonlinear optimization can be used to treat nonlinear relationships and constraints associated with etch processes to maximize performance of a multistep etch process by adjusting the recipe after each run.

The IM data can be fed forward to the optimizer to calculate the value of manipulated variables (MV). The nonlinear model formulas associated with each controlled variable (CV) can be used with each CV target value. A quadratic objective function can utilize weighting factors to prioritize each CV term in the objective function, and an optimizer in the MLMIMO can be used to determine etch recipe by minimizing or maximizing the objective function with the constraints of MVs using nonlinear programming.

In 935, one or more of the substrates can be processed using the adjusted recipe. For example, the adjusted recipe can include optimized MVs from the optimizer.

In 940, measurement data can be obtained for one or more of the processed substrates. For example, measurements can be made at one or more sites on the substrate. After each of the etch processes, the output CVs can be measured using the IM tool.

In 945, the obtained data can be filtered and/or qualified.

In 950, a process error can be calculated. For example, errors (actual outputs minus model outputs) can be calculated for each CV.

In 955, feedback data items can be calculated. For example, errors can be used to update the MLMIMO model CVs offsets using an exponentially weighted moving average (EWMA) filter.

In 960, new model offsets can be updated. These offset values can be provided to the optimizer unit to be used for compensating the disturbance for next run. This offset is used until a new update comes out. This procedure can be performed until the final substrate is processed.

When new and/or additional measurement data, inspection data, and/or evaluation data is required, additional MLMIMO data can be obtained from one or more sites on the substrate. For example, measurement structures, such as periodic gratings, periodic arrays, and/or other periodic structures, on a substrate can be measured at one or more sites.

In some embodiments, the historical and/or real-time data can include MLMIMO maps, substrate-related maps, process-related maps, damage-assessment maps, reference maps, measurement maps, prediction maps, risk maps, inspection maps, verification maps, evaluation maps, particle maps, and/or confidence map(s) for one or more substrates. In addition, some MLMIMO procedures may use substrate maps that can include one or more Goodness Of Fit (GOF) maps, one or more thickness maps, one or more gate-related maps, one or more Critical Dimension (CD) maps, one or more CD profile maps, one or more material related maps, one or more structure-related maps, one or more sidewall angle maps, one or more differential width maps, or a combination thereof.

When substrate maps are created and/or modified, values may not be calculated and/or required for the entire substrate, and a substrate map may include data for one or more sites, one or more chip/dies, one or more different areas, and/or one or more differently shaped areas. For example, a processing chamber may have unique characteristics that may affect the quality of the processing results in certain areas of the substrate. In addition, a manufacturer may allow less accurate process and/or evaluation data for chips/dies in one or more regions of the substrate to maximize yield. When a value in a map is close to a limit, the confidence value may be lower than when the value in a map is not close to a limit. In addition, the accuracy values can be weighted for different chips/dies and/or different areas of the substrate. For example, a higher confidence weight can be assigned to the accuracy calculations and/or accuracy data associated with one or more of the previously used evaluation sites.

In addition, process result, measurement, inspection, verification, evaluation, and/or prediction maps associated with one or more processes may be used to calculate a confidence map for a substrate. For example, values from another map may be used as weighting factors.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method for establishing a Multi-Layer/Multi-Input/Multi-Output (MLMIMO) model comprising:

determining a first multi-layer processing sequence to create one or more final poly-gate structures in one or more multi-layer gate structures, wherein the first multi-layer processing sequence includes one or more first measurement procedures, one or more Partial-Etch (PE) procedures, one or more Final-Etch (F-E) procedures, and one or more second measurement procedures, wherein a final poly-gate structure comprises at least one sidewall angle (SWA) and at least one gate-width, the SWA being between approximately eighty-five degrees and approximately ninety-two degrees, and the gate-width being between approximately twenty nanometers and approximately fifty nanometers;

selecting a first Multi-Layer/Multi-Input/Multi-Output (MLMIMO) model configured to simulate the first multi-layer processing sequence, the first MLMIMO including a plurality of Controlled Variables (CVs), a plurality of Manipulated Variables (MVs), and a plurality of Disturbance Variables (DVs);

determining a first set of DVs associated with the first MLMIMO, wherein one or more of the first measurement procedures are configured to provide one or more of the DVs, one or more of the DVs being determined by a preceding procedure or layer;

determining a first set of CVs associated with the first MLMIMO and ranges associated with the CVs, wherein the CVs include one or more critical dimensions (CDs) associated with the final poly-gate structure and one or more SWAs associated with the final poly-gate structures, wherein one or more of the second measurement procedures are configured to provide one or more of the first set of CVs;

establishing a first set of MVs associated with the first MLMIMO using one or more candidate recipes, wherein the first set of MVs includes one or more Within-Wafer Manipulated Variables (WiW-MVs) configured to change while a substrate is being processed, and one or more Wafer-to-Wafer-Manipulated Variables (W2W-MVs) configured to change after the substrate has been processed;

analyzing the MLMIMO model, wherein one or more statistical models are selected, one or more ranges are provided for the CVs and the MVs, and one or more statistical analysis procedures are performed to establish Design of Experiments (DOE) data, wherein the statistical models are configured to associate one or more MVs with one or more CVs;

establishing one or more nonlinear models having quadratic and interaction terms by using a least squares technique and statistical software;

creating one or more steady-state linear gain matrices (G) using the DOE data, wherein each gain matrix includes a first number of MVs and a second number of CVs;

calculating one or more Relative Gain Arrays (RGA) using one or more of the steady-state linear gain matrices (G), wherein $RGA = G \circledast (G^{-1})^T$ and $\circledast$ denotes element-by-element multiplication;

optimizing one or more sets of MVs using one or more pairing rules;

determining one or more stability conditions for the MLMIMO; and optimizing the MLMIMO using performance parameters associated with a first set of processing tools configured to perform the first multi-layer processing sequence.

2. The method of claim 1, wherein the first measurement procedures comprises:

$$\lambda ij = \frac{\left[\frac{\partial CV_i}{\partial MV_j}\right]_{MV_{k,k \neq j}}}{\left[\frac{\partial CV_i}{\partial MV_j}\right]_{CV_{k,k \neq j}}} = \frac{\text{Gain(open - loop)}}{\text{Gain(closed - loop)}}$$

wherein i=1, 2, ..., n and j=1, 2, ..., n, and wherein $(\partial CV_i/\partial MV_j)_{MV}$ is an open-loop gain between $CV_i$ and $MV_j$, and $(\partial CV_i/\partial MV_j)_{CV}$ is a closed loop gain.

3. The method of claim 1, wherein the one or more stability conditions are determined using a Niederlinski Stability Theorem wherein:

$$NST = \frac{\det(G)}{\prod_{i=1}^{n} g_{ii}} < 0$$

wherein G is a gain matrix and $g_{ii}$ is diagonal elements of the gain matrix.

4. The method of claim 1, wherein a condition of a gain matrix (G) can be determined using:

$$G = USV^T$$

wherein G, U, S, and V are matrices determined using singular value decomposition (SVD).

5. The method of claim 1, wherein the first measurement procedures comprises:

obtaining first metrology data for a first evaluation substrate using a first metrology subsystem, the first metrology data including Integrated Metrology (IM) data for a first photoresist feature in a photoresist layer associated with the final poly-gate structures.

6. The method of claim 1, wherein the first metrology data includes thickness data, top CD data, bottom CD data, sidewall angle data, or optical data for one or more first photoresist features in a center region and for one or more second photoresist features in an edge region.

7. The method as claimed in claim 1, further comprising:

transferring a first substrate to a first etching chamber in a first etching subsystem using a transfer subsystem coupled to the first etching subsystem, wherein the transfer subsystem is configured to prevent an oxide layer from forming on the first substrate during the transferring;

establishing a first substrate holder temperature during a first P-E procedure, the first substrate holder temperature being between approximately 40 degrees Celsius and 70 degrees Celsius, and wherein the first etching subsystem comprises a temperature control system configured to control the first substrate holder temperature during the first P-E procedure; and establishing a second substrate holder temperature during a first F-E procedure, the second substrate holder temperature being between approximately 40 degrees Celsius and 70 degrees Celsius, and wherein the temperature control system is configured to control the second substrate holder temperature during the first F-E procedure.

8. The method as claimed in claim 7, further comprising:
operating a first radio frequency (RF) source in a first frequency range from approximately 0.1 MHz, to approximately 200 MHz and in a first power range from approximately 100 watts to approximately 700 watts during the first P-E procedure and during the first F-E procedure, wherein the first RF source is coupled to an upper electrode in the first etching chamber; and operating a second RF source in a second frequency range from approximately 0.1 MHz, to approximately 100 MHz and in a second power range from approximately 10 watts to approximately 170 watts during the first P-E procedure and during the first F-E procedure, wherein the second RF source is coupled to a lower electrode in the first etching chamber.

9. The method as claimed in claim 7, further comprising:
providing a first process gas into the first etching chamber during the first P-E procedure, wherein the first process gas includes $CF_4$ and $O_2$, a $CF_4$ flow rate varying between approximately 10 sccm and approximately 50 sccm and a first $O_2$ flow rate varying between approximately 3 sccm and approximately 20 sccm wherein the first etching subsystem comprises a gas supply system configured to provide the first process gas to the first etching chamber during the first P-E procedure; and providing a second process gas into the first etching chamber during the first F-E procedure, wherein the second process gas includes HBr and $O_2$, a HBr flow rate varying between approximately 20 sccm and approximately 600 sccm and a second $O_2$ flow rate varying between approximately 2 sccm and approximately 10 sccm, wherein the gas supply system is configured to provide the second process gas to the first etching chamber during the first F-E procedure.

10. The method as claimed in claim 7, further comprising:
controlling a first pressure in the first etching chamber between approximately 5 mTorr and approximately 40 mTorr during the first P-E procedure; and controlling a second pressure in the first etching chamber between approximately 5 mTorr and approximately 40 mTorr during the first F-E procedure, wherein the first etching subsystem comprises a vacuum pumping system configured to control the first pressure and the second pressure in the first etching chamber.

11. The method as claimed in claim 1, wherein the DOE data includes performance data from sensors intrinsic to a plasma processing chamber and sensors extrinsic to the plasma processing chamber, wherein the performance data includes Helium backside gas pressure data, Helium backside flow data, electrostatic clamping (ESC) voltage data, ESC current data, substrate holder temperature data, coolant temperature data, upper electrode (UEL) temperature data, forward RF power data, reflected RF power data, RF self-induced DC bias data, RF peak-to-peak voltage data, chamber wall temperature data, process gas flow rate data, process gas partial pressures data, chamber pressure data, matching network data, focus ring thickness data, RF hours data, or focus ring RF hours data, or any combination thereof.

12. The method as claimed in claim 1, wherein the DOE data includes performance optical data, End Point Detector (EPD) data, current and/or voltage probe data, power meter data, spectrum analyzer data, RF Impedance analyzer data, time domain data, or frequency domain data, or any combination thereof.

13. The method as claimed in claim 1, wherein the multilayer gate structures, include pFET structures, nFET structures, Tri-gate structures, and FinFET structures.

14. A method for using a Multi-Layer/Multi-Input/Multi-Output (MLMIMO) model to create gate structures on a plurality of substrates, the method comprising:

a) receiving a first set of substrates and associated substrate data, the substrate data including real-time and historical data;

b) establishing a first number (l) of disturbance variables DV(l) using real-time integrated metrology (IM) data associated with a patterned photoresist layer on one or more incoming substrates, wherein the real-time IM data includes critical dimension (CD) data, sidewall angle (SWA) data, thickness data, photoresist data, BARC data, wafer substrate data, and diffraction signal data from multiple sites in the patterned photoresist layer on each incoming substrate, wherein l is a first integer greater than two;

c) establishing a second number (m) of manipulated variables MV(m), wherein m is a second integer greater than two;

d) establishing a third number (n) of control variables, wherein n is a third integer greater than two and CV(n) is defined as $CV(n)=f_n\{MV(1),\ldots MV(m-1),MV(m),DV(1),\ldots DV(l-1),DV(l)\}+\text{offsets}_n$ e) calculating optimized process settings using a quadratic objective function, and target deviations t(n) defined as:

$t(n)=\{DV(n)-\text{target }CV(n)\};$ f) calculating a plurality of manipulated variables MV(l);

g) defining an adjusted process recipe using one or more of the calculated manipulated variables MV(l) established during nonlinear programming;

h) processing one or more of the first set of substrates using the adjusted process recipe;

I) obtaining additional measurement data for one or more of the processed substrates, wherein new controlled variable (CV) data is obtained and filtered;

j) calculating one or more process errors using differences between measured control variable data and predicted control variable data;

k) calculating feedback data items, wherein errors are used to update the offsets$_n$ using an exponentially weighted moving average (EWMA) filter;

l) updating the model offsets$_n$ in an optimizer unit; and m) repeating steps a)-l) using each substrate in the first set of substrates.

15. The method as claimed in claim 14, wherein the plurality of manipulated variables MV(l) are calculated by performing nonlinear programming using the quadratic objective function defined as, $$\min_{MV(1),MV(2),MV(n-1),MV(n)} \left\{ \left(\frac{t(1)-CV(1)}{t(1)}\right)^2 w_1 + \left(\frac{t(2)-CV(2)}{t(2)}\right)^2 w_2 \ldots + \left(\frac{t(n-1)-CV(n-1)}{t(n-1)}\right)^2 w_{j-1} + + \left(\frac{t(n)-CV(n)}{t(n)}\right)^2 w_j \right\}$$

wherein the $w_j$ are weighting factors, and the manipulated variables MV(l) have upper and lower threshold values defined as inequality constraints:

lower_threshold_value(*l*)≦MV(*l*)≦upper_threshold_value(*l*)

and the lower_threshold_value(l) and the upper_threshold_value(l) are determined using a plurality of equipment constraints.

16. The method as claimed in claim 14, wherein the weightings $w_j$ are dynamically updated based on feedback error of each CV term.

17. The method as claimed in claim 14, wherein one or more control variable targets are prioritized when one or more manipulated variables are outside an allowable process window.

18. The method as claimed in claim 14, wherein the adjusted process recipe is defined using process state data.

19. The method as claimed in claim 14, wherein the adjusted process recipe is defined using chamber state data.

* * * * *